(12) United States Patent
Park et al.

(10) Patent No.: US 11,335,679 B2
(45) Date of Patent: May 17, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jae Hyun Park, Hwaseong-si (KR); Heonjong Shin, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 96 days.

(21) Appl. No.: 16/825,030

(22) Filed: Mar. 20, 2020

(65) Prior Publication Data
US 2021/0035971 A1 Feb. 4, 2021

(30) Foreign Application Priority Data
Aug. 2, 2019 (KR) .................... 10-2019-0094554

(51) Int. Cl.
| | |
|---|---|
| *H01L 27/088* | (2006.01) |
| *H01L 29/78* | (2006.01) |
| *H01L 21/8234* | (2006.01) |
| *H01L 29/66* | (2006.01) |
| *H01L 21/768* | (2006.01) |

(52) U.S. Cl.
CPC .. *H01L 27/0886* (2013.01); *H01L 21/823431* (2013.01); *H01L 21/823437* (2013.01); *H01L 29/66795* (2013.01); *H01L 29/7851* (2013.01); *H01L 21/76802* (2013.01)

(58) Field of Classification Search
CPC ......... H01L 27/0886; H01L 21/823431; H01L 21/823437; H01L 21/76802; H01L 29/66795; H01L 29/7851
See application file for complete search history.

(56) References Cited

U.S. PATENT DOCUMENTS

| | | | |
|---|---|---|---|
| 9,064,932 B1 | 6/2015 | Pham et al. | |
| 9,553,090 B2 | 1/2017 | Chang et al. | |
| 9,559,009 B2 | 1/2017 | Cai et al. | |
| 9,601,366 B2 | 3/2017 | Greene et al. | |
| 9,679,985 B1 | 6/2017 | Wu et al. | |
| 9,806,166 B2 | 10/2017 | Myung et al. | |
| 10,177,240 B2 | 1/2019 | Greene et al. | |
| 2005/0001252 A1* | 1/2005 | Kim ............... | H01L 21/823437 257/296 |
| 2015/0054078 A1* | 2/2015 | Xie .................. | H01L 27/1211 257/347 |

(Continued)

*Primary Examiner* — Christine A Enad
(74) *Attorney, Agent, or Firm* — F. Chau & Associates, LLC

(57) ABSTRACT

Disclosed are a semiconductor device and a method of fabricating the same. The semiconductor device includes first and second gate patterns that are spaced apart from each other in a first direction on a substrate and extend in the first direction, a separation pattern that is disposed between and being in direct contact with the first and second gate patterns and extends in a second direction intersecting the first direction, a third gate pattern that is spaced apart in the second direction from the first gate pattern and extends in the first direction, and an interlayer dielectric layer disposed between the first gate pattern and the third gate pattern. The separation pattern includes a material different from a material of the interlayer dielectric layer. A bottom surface of the separation pattern has an uneven structure.

20 Claims, 40 Drawing Sheets

(56) References Cited

U.S. PATENT DOCUMENTS

| | | |
|---|---|---|
| 2017/0148682 A1 | 5/2017 | Basker et al. |
| 2017/0154966 A1* | 6/2017 | Huang .............. H01L 29/66795 |
| 2017/0162568 A1* | 6/2017 | Song .................. H01L 27/0924 |
| 2018/0350928 A1 | 12/2018 | Huang et al. |
| 2019/0103325 A1 | 4/2019 | Huang et al. |
| 2019/0280087 A1 | 9/2019 | Park et al. |
| 2019/0312124 A1 | 10/2019 | Lee et al. |
| 2019/0363085 A1 | 11/2019 | Oh et al. |

* cited by examiner

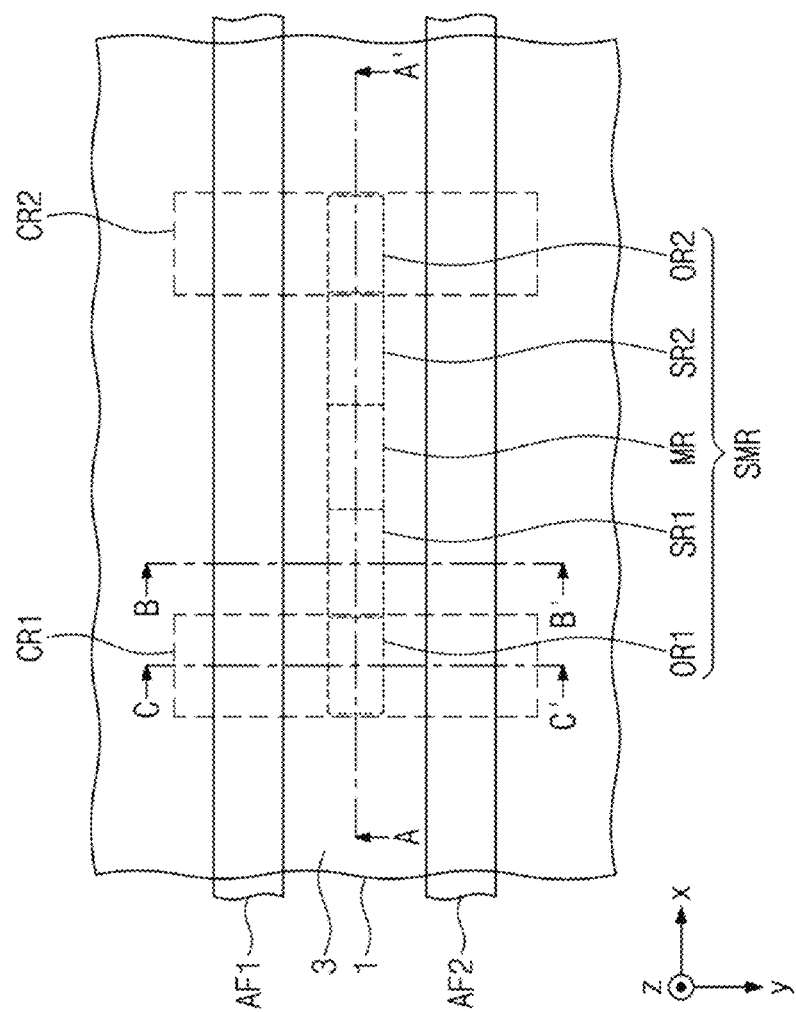

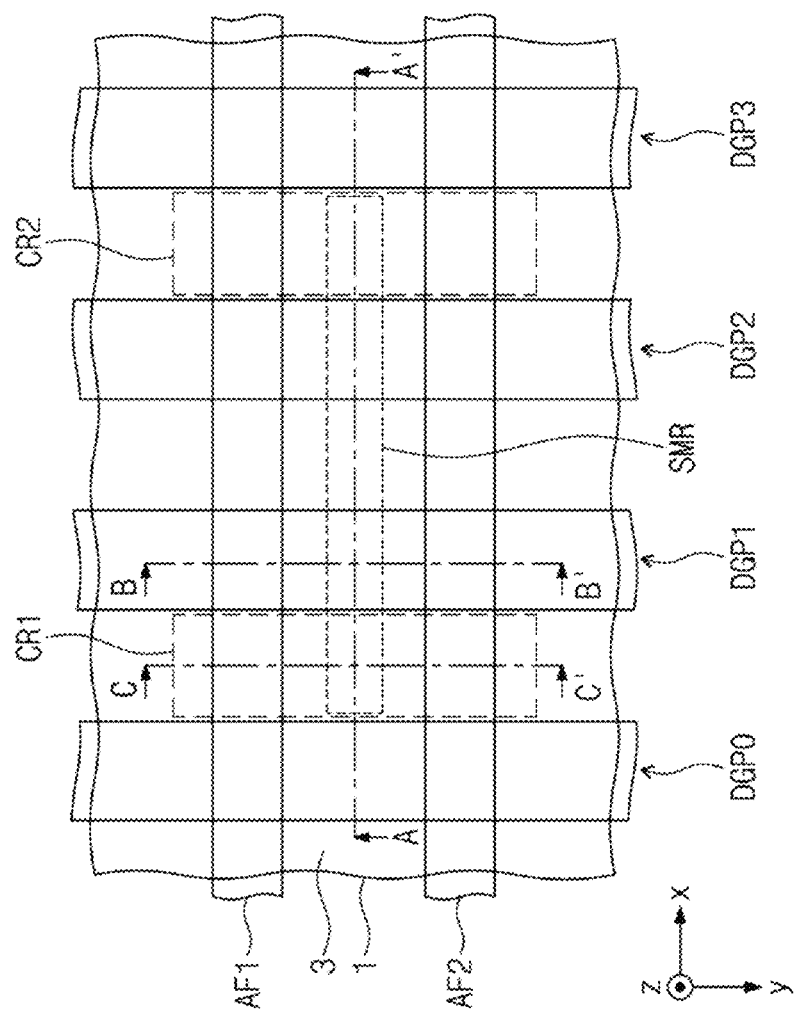

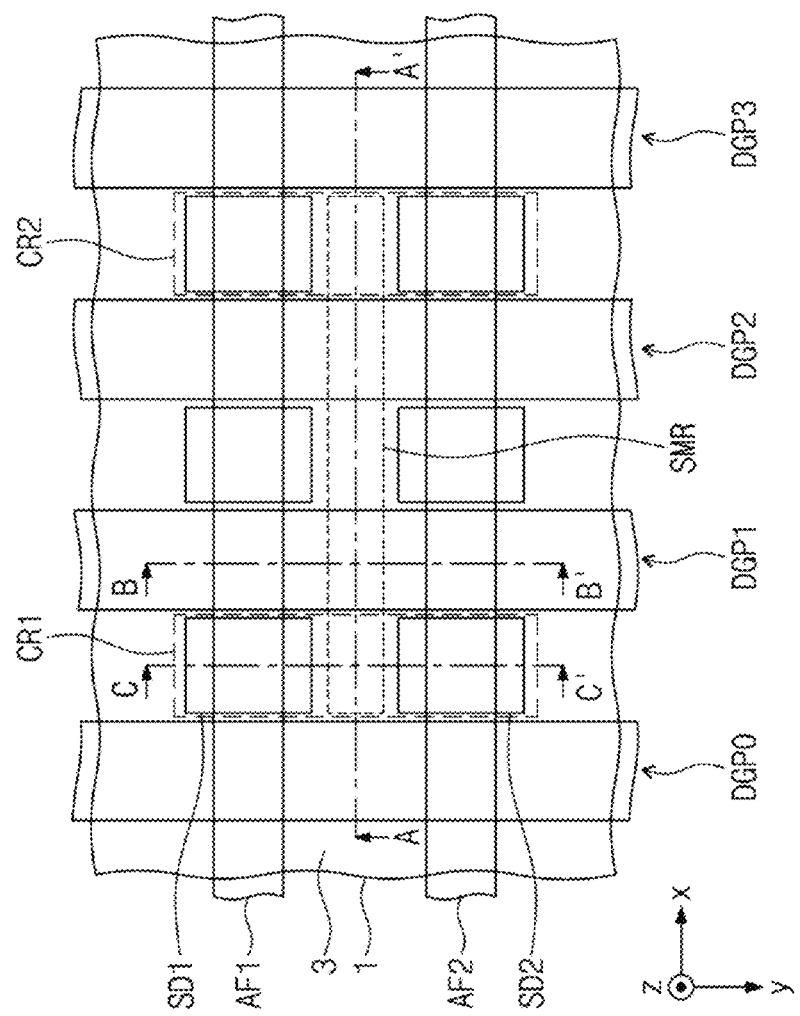

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2019-0094554, filed on Aug. 2, 2019, in the Korean Intellectual Property Office, the disclosures of which are incorporated by reference herein in their entirety.

TECHNICAL FIELD

The present inventive concept relates to a semiconductor device and a method of fabricating the same, and more particularly, to a semiconductor device including a fin field effect transistor and a method of fabricating the same.

DISCUSSION OF RELATED ART

Metal oxide semiconductor field effect transistors (MOSFETs) are widely used semiconductor devices in very large scale integrated circuits. As the semiconductor devices become increasingly integrated with the advancement of the electronic industry, the MOSFETs have been scaled down in accordance with the reduced design rule of the semiconductor devices. The scale down of MOSFETs may deteriorate operating characteristics of the semiconductor devices. Accordingly, a variety of research has been conducted to develop methods of fabricating semiconductor devices having superior performance while overcoming issues associated with high integration of the semiconductor devices.

SUMMARY

Example embodiments of the present inventive concept provide a semiconductor device with enhanced reliability, and also provide a method of fabricating the semiconductor device, in which the method can increase yield.

According to an example embodiment of the present inventive concept, a semiconductor device may include: a first gate pattern and a second gate pattern that are spaced apart from each other in a first direction on a substrate, each of the first gate pattern and the second gate pattern extending in the first direction; a separation pattern disposed between and being in direct contact with the first gate pattern and the second gate pattern, the separation pattern extending in a second direction that intersects the first direction; a third gate pattern spaced apart in the second direction from the first gate pattern, the third gate pattern extending in the first direction; and an interlayer dielectric layer disposed between the first gate pattern and the third gate pattern. The separation pattern may include a material different from a material of the interlayer dielectric layer. A bottom surface of the separation pattern may have an uneven structure.

According to an example embodiment of the present inventive concept, a semiconductor device may include: a first active fin and a second active fin that protrude from a substrate and are spaced apart from each other; a device isolation layer that covers a top surface of the substrate and exposes a top surface and a lateral surface of the first active fin and a top surface and a lateral surface of the second active fin; a first gate pattern that covers the top surface and the lateral surface of the first active fin; a second gate pattern that is spaced apart in a first direction from the first gate pattern and covers the top surface and the lateral surface of the second active fin; a first interlayer dielectric layer that covers a lateral surface of the first gate pattern; and a first separation pattern disposed on the device isolation layer between the first gate pattern and the second gate pattern, the first separation pattern being in direct contact with the first gate pattern and the second gate pattern. The first separation pattern may include a material different from a material of the first interlayer dielectric layer. The first separation pattern may include: a first separation segment disposed between the first gate pattern and the second gate pattern; and a first part that extends from the first separation segment and is positioned outside one sidewall of the first gate pattern.

According to an example embodiment of the present inventive concept, a semiconductor device may include: a first gate pattern and a second gate pattern that are spaced apart from each other in a first direction on a substrate; a first interlayer dielectric layer being in contact with a sidewall of the first gate pattern; a separation pattern disposed between the first gate pattern and the second gate pattern and being in direct contact with the first gate pattern and the second gate pattern; a first source/drain pattern positioned adjacent to the first gate pattern; a second source/drain pattern positioned adjacent to the second gate pattern; and a contact plug being in direct contact with top surfaces of the first and second source/drain patterns. The separation pattern may include a material different from a material of the first interlayer dielectric layer. A bottom surface of the contact plug may have an uneven structure.

According to an example embodiment of the present inventive concept, a method of fabricating a semiconductor device may include: preparing a substrate that includes a separation mask opening region extending in a first direction and a contact region intersecting the separation mask opening region, the separation mask opening region including a separation region and an overlapping region that overlaps the contact region; forming a preliminary gate pattern on the substrate, the preliminary gate pattern running across the separation region on a side of the contact region; forming an interlayer dielectric layer that is on the contact region and covers a sidewall of the preliminary gate pattern; removing the preliminary gate pattern from the separation region and etching a portion of the interlayer dielectric layer to form a first gate pattern and a second gate pattern and simultaneously to form a separation trench on the separation mask opening region; forming a separation pattern that fills the separation trench, the separation pattern including a material different from a material of the interlayer dielectric layer; replacing at least a portion of the separation pattern with a buried dielectric pattern on the overlapping region; forming a contact hole by removing the interlayer dielectric layer from the contact region and removing the buried dielectric pattern from the overlapping region; and forming a contact plug in the contact hole.

According to an example embodiment of the present inventive concept, a method of fabricating a semiconductor device may include: preparing a substrate that includes a separation mask opening region extending in a first direction and a contact region intersecting the separation mask opening region, the separation mask opening region including a separation region and an overlapping region that overlaps the contact region; forming a preliminary gate pattern on the substrate, the preliminary gate pattern running across the separation region on a side of the contact region; forming an interlayer dielectric layer that is on the contact region and covers a sidewall of the preliminary gate pattern; removing the preliminary gate pattern from the separation region and etching a portion of the interlayer dielectric layer to form a first gate pattern and a second gate pattern and simultaneously to form a separation trench on the separation mask opening region; forming a sacrificial pattern in the separation trench on the separation region; forming a buried dielectric pattern in the separation trench on the overlapping region; and replacing the sacrificial pattern with a separation pattern. The separation pattern may include a material different from a material of the interlayer dielectric layer.

BRIEF DESCRIPTION OF THE DRAWINGS

The above and other aspects and features of the present inventive concept will become more apparent by describing in detail example embodiments thereof with reference to the accompanying drawings, in which:

FIGS. 2A to 8A illustrate plan views showing a method of fabricating the semiconductor device of FIG. 1A;

FIGS. 2B to 8B illustrate cross-sectional views showing a method of fabricating the semiconductor device of FIG. 1B;

Figure 1A:
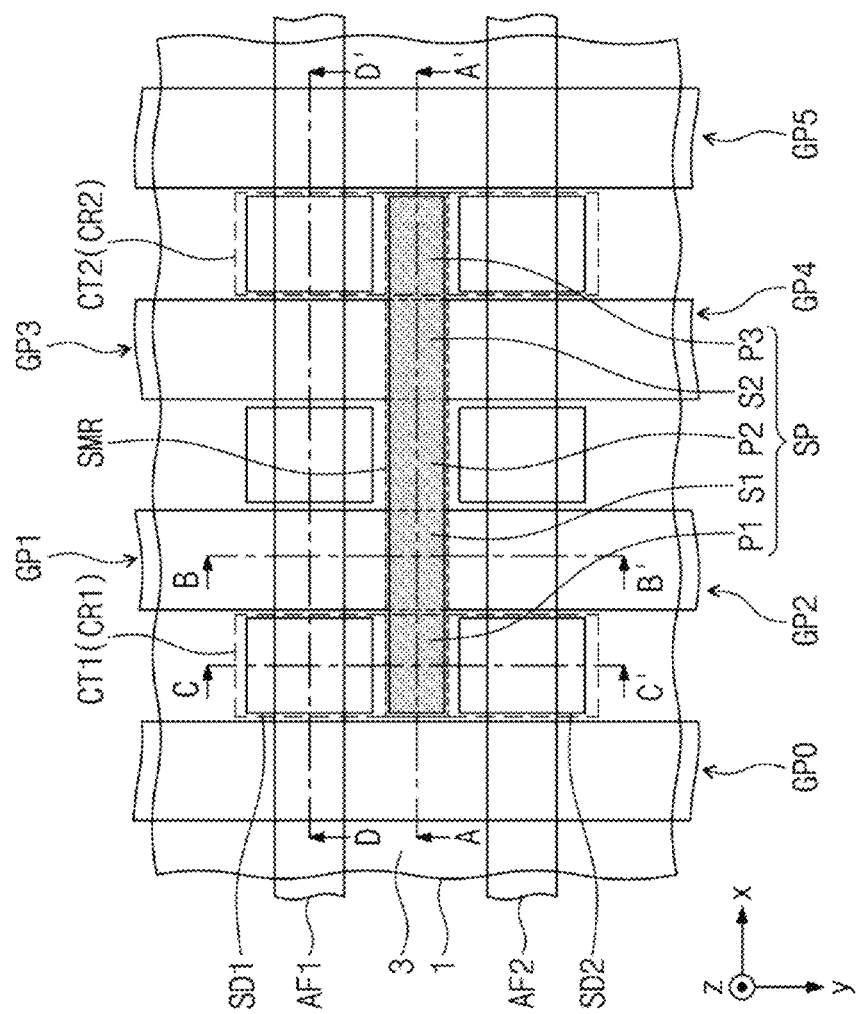
FIG. 1A illustrates a plan view showing a semiconductor device according to an example embodiment of the present inventive concept.

Since the drawings in FIGS. 1-20 are intended for illustrative purposes, the elements in the drawings are not necessarily drawn to scale. For example, some of the elements may be enlarged or exaggerated for clarity purpose.

DETAILED DESCRIPTION OF EMBODIMENTS

Example embodiments of the present inventive concept will now be described in detail with reference to the accompanying drawings to aid in clearly explaining the present inventive concept.

Figure 1B:
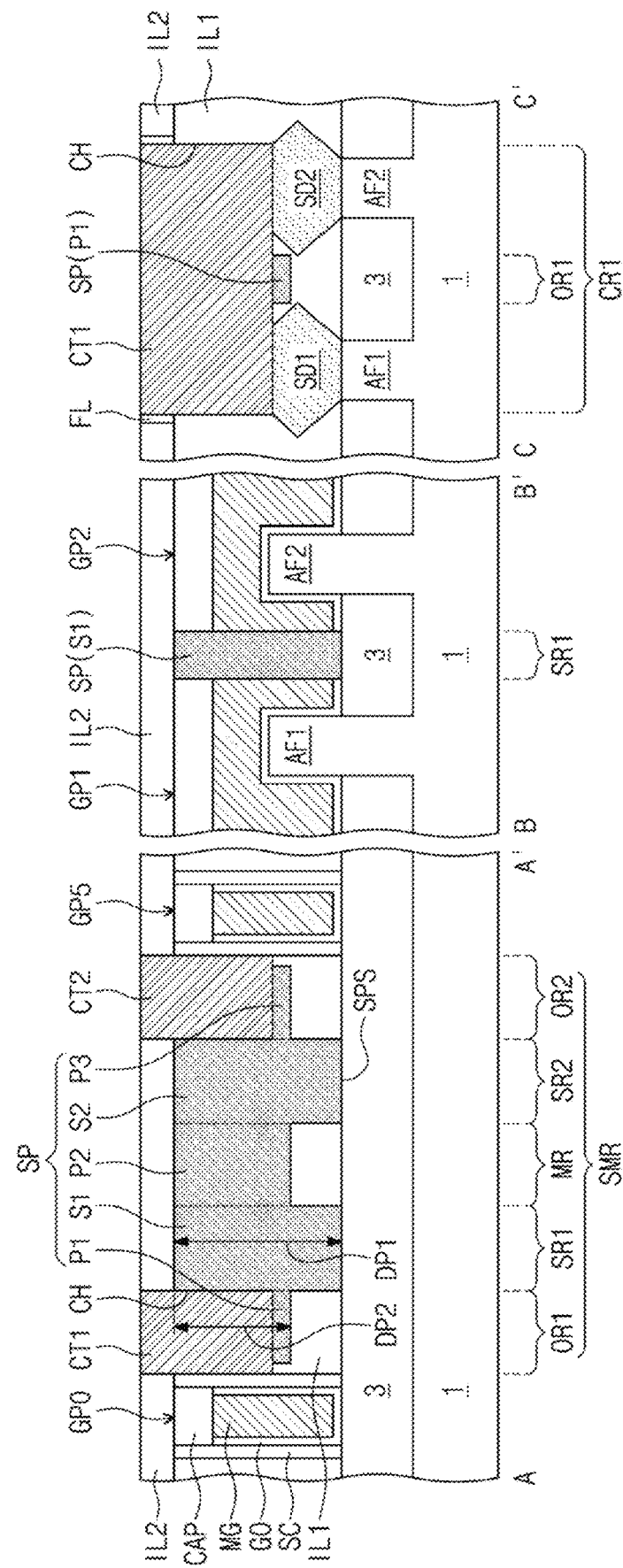
FIG. 1B illustrates a cross-sectional view taken along lines A-A', B-B', and C-C' of FIG. 1A, according to an example embodiment of the present inventive concept.
Figure 1C:
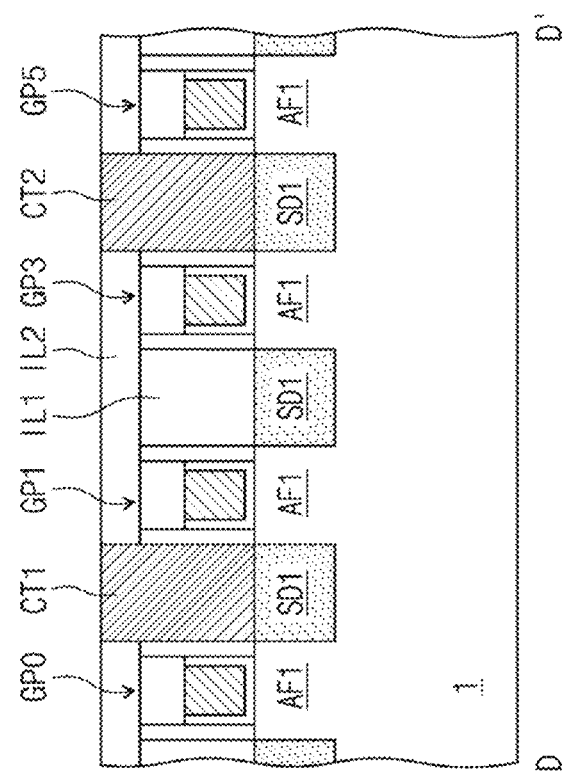
FIG. 1C illustrates a cross-sectional view taken along line D-D' of FIG. 1A, according to an example embodiment of the present inventive concept.

FIG. 1A illustrates a plan view showing a semiconductor device according to an example embodiment of the present inventive concept. FIG. 1B illustrates a cross-sectional view taken along lines A-A', B-B', and C-C' of FIG. 1A, according to an example embodiment of the present inventive concept. FIG. 1C illustrates a cross-sectional view taken along line D-D' of FIG. 1A, according to an example embodiment of the present inventive concept. In FIG. 1A, there is an illustration that may correspond to a portion of a static random-access memory (SRAM) device or to a portion of a logic/peripheral circuit region.

Referring to FIGS. 1A to 1C, a substrate 1 may be provided. The substrate 1 may be, for example, a single-crystalline silicon wafer or a silicon-on-insulator (SOI) substrate. Alternatively, the substrate 1 may be a silicon substrate including silicon (Si), for example, single crystalline silicon (Si), polycrystalline silicon (Si), amorphous silicon (Si), or a combination thereof, and/or may include other materials such as silicon germanium (SiGe), silicon germanium on insulator (SGOI), indium antimonide (InSb), a lead tellurium compound (PbTe), gallium phosphide (GaP), indium arsenide (InAs), indium phosphide (InP), gallium arsenide (GaAs), or gallium antimonide (GaSb). The substrate 1 may include a separation mask opening region SMR and a contact region CR1 and CR2. When viewed in plan view, the separation mask opening region SMR may have a bar shape that extends in a first direction x. The contact region CR1 and CR2 may include a first contact region CR1 and a second contact region CR2 that are spaced apart from each other in the first direction x. When viewed in plan view, the first and second contact regions CR1 and CR2 may each have a bar shape that extends in a second direction y intersecting the first direction x. When viewed in plan view, the separation mask opening region SMR may overlap the contact region CR1 and CR2. A first overlapping region OR1 may be defined to indicate an area where the separation mask opening region SMR overlaps the first contact region CR1. A second overlapping region OR2 may be defined to indicate an area where the separation mask opening region SMR overlaps the second contact region CR2.

A first active fin AF1 and a second active fin AF2 may protrude from a top surface of the substrate 1. When viewed in plan view, the first active fin AF1 and the second active fin AF2 may each have a linear shape that extends in the first direction x, and may be spaced apart from each other in the second direction y. The first active fin AF1 and the second active fin AF2 may be arranged in parallel to each other. A device isolation layer 3 may cover the top surface of the substrate 1 and lower lateral surfaces of the first and second active fins AF1 and AF2, and thus may surround and define the first and second active fins AF1 and AF2. The device isolation layer 3 may have a single-layered or multi-layered structure including one or more selected from, for example, a silicon oxide ($SiO_2$) layer, a silicon nitride ($Si_3N_4$) layer, and a silicon oxynitride (SiON) layer. The device isolation layer 3 may have a top surface lower than those of the first and second active fins AF1 and AF2.

Gate patterns GP0 to GP5 may each run across the first active fin AF1 and/or the second active fin AF2. A zeroth gate pattern GP0 and a fifth gate pattern GP5 that are spaced apart from each other in the first direction x may each run across all of the first and second active fins AF1 and AF2. A first gate pattern GP1 and a second gate pattern GP2 may be positioned between the zeroth gate pattern GP0 and the fifth gate pattern GP5, and may be spaced apart from each other in the second direction y. A third gate pattern GP3 may be disposed between the first gate pattern GP1 and the fifth gate pattern GP5. A fourth gate pattern GP4 may be disposed between the second gate pattern GP2 and the fifth gate pattern GP5. The third gate pattern GP3 and the fourth gate pattern GP4 may be spaced apart from each other in the second direction y. The first gate pattern GP1 and the third gate pattern GP3 may each run across the first active fin AF1. The second gate pattern GP2 and the fourth gate pattern GP4 may each run across the second active fin AF2. The gate patterns GP0 to GP5 are arranged neither on the separation mask opening region SMR, nor on the first and second contact regions CR1 and CR2.

Each of the gate patterns GP0 to GP5 may include a gate dielectric layer GO, a gate electrode MG, and a gate capping pattern CAP. The gate dielectric layer GO may include one or more selected from, for example, a silicon oxide ($SiO_2$) layer and a high-k dielectric layer whose dielectric constant is greater than that of a silicon oxide ($SiO_2$) layer. The high-k dielectric layer may include a metal oxide layer, such as, for example, a hafnium oxide ($HfO_2$) layer, a lanthanum oxide ($La_2O_3$) layer, a zirconium oxide ($ZrO_2$) layer, a tantalum oxide ($Ta_2O_5$) layer, a titanium oxide ($TiO_2$) layer, or an aluminum oxide ($Al_2O_3$) layer. The gate electrode MG may include one or more selected from, for example, an impurity-doped polysilicon (p-Si) layer, a metal nitride layer such as, for example, a titanium nitride (TiN) layer, a tungsten nitride (WN) layer, a molybdenum nitride (MoN) layer, and a tantalum nitride (TaN) layer, and a metal layer such as, for example, a tungsten (W) layer, a copper (Cu) layer, a titanium (Ti) layer, a tantalum (Ta) layer, a molybdenum (Mo) layer, and an aluminum (Al) layer. The gate capping pattern CAP may include a silicon nitride ($Si_3N_4$) layer.

A separation pattern SP may be interposed between the first and second gate patterns GP1 and GP2 to separate the first and second gate patterns GP1 and GP2, and between the third and fourth gate patterns GP3 and GP4 to separate the third and fourth gate patterns GP3 and GP4. The separation pattern SP may be positioned on the separation mask opening region SMR of the substrate 1. The separation pattern SP may be placed on the device isolation layer 3 between neighboring first and second active fins AF1 and AF2. The separation pattern SP may be in contact with the device isolation layer 3. For example, a portion of the separation pattern SP sandwiched between the first and second gate patterns GP1 and GP2 may be in contact with the device isolation layer 3 to electrically isolate the first and second gate patterns GP1 and GP2, and a portion of the separation pattern SP sandwiched between the third and fourth gate patterns GP3 and GP4 may be in contact with the device isolation layer 3 to electrically isolate the third and fourth gate patterns GP3 and GP4. The separation pattern SP may have a top surface at a height the same as that of those of the gate patterns GP0 to GP5.

The separation pattern SP may include a first protrusion segment P1, a first separation segment S1, a second protrusion segment P2, a second separation segment S2, and a third protrusion segment P3. The first separation segment S1 may be positioned between and in direct contact with the first gate pattern GP1 and the second gate pattern GP2. The first separation segment S1 may also be in direct contact with the device isolation layer 3, so that the formation of a gate-bridge between the first gate pattern GP1 and the second gate pattern GP2 may be prevented. The second separation segment S2 may be positioned between and in direct contact with the third gate pattern GP3 and the fourth gate pattern GP4. The second separation segment S2 may also be in direct contact with the device isolation layer 3, so that the formation of a gate-bridge between the third gate pattern GP3 and the fourth gate pattern GP4 may be prevented. The first separation segment S1 may be placed on a first separation region SR1 of the substrate 1. The second separation segment S2 may be placed on a second separation region SR2 of the substrate 1.

The first protrusion segment P1 may be connected to the first separation segment S1 and may protrude toward the first overlapping region OR1. The second protrusion segment P2 may be disposed between and may connect the first separation segment S1 and the second separation segment S2. The first separation segment S1 may be disposed between and may connect the first protrusion segment P1 and the second protrusion segment P2. The third protrusion segment P3 may be connected to the second separation segment S2 and may protrude toward the second overlapping region OR2. The second separation segment S2 may be disposed between and may connect the second protrusion segment P2 and the third protrusion segment P3. The first protrusion segment P1 may be positioned on the first overlapping region OR1 of the substrate 1. The third protrusion segment P3 may be positioned on the second overlapping region OR2 of the substrate 1. On the substrate 1, the second protrusion segment P2 may be positioned on a middle region MR between the first separation region SR1 and the second separation region SR2. The separation mask opening region SMR may include the first and second overlapping regions OR1 and OR2, the first and second separation regions SR1 and SR2, and the middle region MR.

The first separation segment S1, the second protrusion segment P2, and the second separation segment S2 may have their top surfaces at the same height, for example, being coplanar. The first and third protrusion segments P1 and P3 may have their top surfaces lower than those of the first separation segment S1, the second protrusion segment P2, and the second separation segment S2. The first and second separation segments S1 and S2 may have their bottom surfaces at the same height, and may be in contact with the device isolation layer 3. The first, second, and third protrusion segments P1, P2, and P3 may have their bottom surfaces at the same height. The bottom surfaces of the first, second, and third protrusion segments P1, P2, and P3 may be higher than those of the first and second separation segments Si and S2. For example, the second protrusion segment P2 may extend from the first separation segment S1 in a direction away from the first protrusion segment P1, and the top surface of the second protrusion segment P2 may be coplanar with a top surface of the first separation segment S1. For example, the third protrusion segment P3 may extend from the second separation segment S2 in a direction away from the second protrusion segment P2, and the third protrusion segment P3 may have a thickness the same as a thickness of the first protrusion segment P1. The thickness of the second protrusion segment P2 may be larger than a thickness of the third protrusion segment P3. The thickness is measured in a third direction z.

The gate patterns GP0 to GP5 may have their sidewalls covered with spacers SC. The spacer SC may have a single-layered or multi-layered structure including one or more selected from, for example, a silicon oxide ($SiO_2$) layer, a silicon nitride ($Si_3N_4$) layer, and a silicon oxynitride (SiON) layer. Source/drain patterns SD1 and SD2 may be disposed on the active fins AF1 and AF2 on sides of the gate patterns GP0 to GP5. First source/drain patterns SD1 may be placed on the first active fin AF1, and second source/drain patterns SD2 may be placed on the second active fin AF2. The first and second source/drain patterns SD1 and SD2 may each include a semiconducting material selected from one of, for example, silicon (Si), germanium (Ge), silicon germanium (SiGe), silicon carbide (SiC), gallium arsenide (GaAs), etc. doped with n-type or p-type impurities. The first and second source/drain patterns SD1 and SD2 may have a hexagonal shape, but the present inventive concept is not limited thereto.

Spaces among the gate patterns GP0 to GP5 may be filled with a first interlayer dielectric layer IL1. The first interlayer dielectric layer IL1 may be formed of a material, such as silicon oxide ($SiO_2$), having an etch selectivity with respect to a material of the gate capping pattern CAP. The first interlayer dielectric layer IL1 may cover the source/drain patterns SD1 and SD2. As shown in FIG. 1C, above the first source/drain pattern SD1, the first interlayer dielectric layer IL1 may be disposed between the first gate pattern GP1 and the third gate pattern GP3. A second interlayer dielectric layer IL2 may cover the gate patterns GP0 to GP5, the separation pattern SP, and the first interlayer dielectric layer IL1. The second interlayer dielectric layer IL2 may be formed of a material, such as silicon oxide ($SiO_2$), having an etch selectivity with respect to a material of the gate capping pattern CAP. In an example embodiment of the present inventive concept, the first and second interlayer dielectric layers IL1 and IL2 may be formed of the same material such as silicon oxide ($SiO_2$). However, the present inventive concept is not limited thereto.

On the first contact region CR1, a first contact plug CT1 may penetrate the first and second interlayer dielectric layers IL1 and IL2, and may be in contact with one of the first source/drain patterns SD1 and also with one of the second source/drain patterns SD2. On the second contact region CR2, a second contact plug CT2 may penetrate the first and second interlayer dielectric layers IL1 and IL2, and may be in contact with another of the first source/drain patterns SD1 and also with another of the second source/drain patterns SD2. A buried dielectric pattern FL may be interposed between the second interlayer dielectric layer IL2 and an upper lateral surface of the first contact plug CT1. The buried dielectric pattern FL may include, for example, a silicon oxide ($SiO_2$) layer. The first interlayer dielectric layer IL1, the second interlayer dielectric layer IL2, and the buried dielectric pattern FL may be formed of the same material, and thus may have the same etch rate for ease of creating contact holes CH in the process of forming the first and second contact plugs CT1 and CT2. The first contact plug CT1 may be formed next to the first separation segment S1. For example, the first contact plug CT1 may extend in the second direction y and may adjoin the first separation segment S1 of the separation pattern SP.

The first protrusion segment P1 of the separation pattern SP may be in contact with a bottom surface of the first contact plug CT1. For example, the separation pattern SP may extend in the first direction x, with a portion (e.g., the first protrusion segment P1) being in contact with the bottom surface of the first contact plug CT1. The third protrusion segment P3 of the separation pattern SP may be in contact with a bottom surface of the second contact plug CT2. The first protrusion segment P1 may have one sidewall that is spaced apart from one sidewall of the first contact plug CT1 adjacent to the first protrusion segment P1. A width of the first contact plug CT1 in the first direction x may be larger a width of the first protrusion segment P1 in the first direction x. The third protrusion segment P3 may have one sidewall that is spaced apart from one sidewall of the second contact plug CT2 adjacent to the third protrusion segment P3. A width of the second contact plug CT2 in the first direction x may be larger a width of the third protrusion segment P3 in the first direction x.

A bottom surface SPS of the separation pattern SP may have an uneven structure. Between the first and second gate patterns GP1 and GP2, the bottom surface SPS of the separation pattern SP may have a first depth DP1 from a bottom surface of the second interlayer dielectric layer IL2. For example, the first depth DP1 may be measured in the third direction z from a top surface of the first separation segment S1 to a bottom surface of the first separation segment S1. Below the first contact plug CT1, the bottom surface SPS of the separation pattern SP may have a second depth DP2 from the bottom surface of the second interlayer dielectric layer IL2. For example, the second depth DP2 may be measured in the third direction z from the top surface of the first separation segment S1 to a bottom surface of the first protrusion segment P1. The first depth DP1 may be greater than the second depth DP2. The first protrusion segment P1, the second protrusion segment P2, and the third protrusion segment P3 may be respectively called a first part P1, a second part P2, and a third part P3.

A semiconductor device according to an example embodiment of the present inventive concept may have neither gate-bridges on the separation regions SR1 and SR2 nor contact-connection failure on the overlapping regions OR1 and OR2, which may result in an increase in reliability of the semiconductor device. For example, no gate-bridges may be formed between the first and second gate patterns GP1 and GP2 on the first separation region SR1 and between the third and fourth gate patterns GP3 and GP4 on the second separation region SR2. Respectively on the overlapping regions OR1 and OR2, the first and second contact plugs CT1 and CT2 may each be connected without failure to the first and second source/drain patterns SD1 and SD2. The gate patterns GP0 to GP5, the active fins AF1 and AF2, and the source/drain patterns SD1 and SD2 may constitute a plurality of fin field effect transistors (FinFETs).

FIGS. 2A to 8A illustrate plan views showing a method of fabricating the semiconductor device of FIG. 1A. FIGS. 2B to 8B illustrate cross-sectional views showing a method of fabricating the semiconductor device of FIG. 1B. FIGS. 2B to 8B illustrate cross-sectional views taken along lines A-A', B-B', and C-C' of FIGS. 2A to 8A, respectively.

Figure 2B:
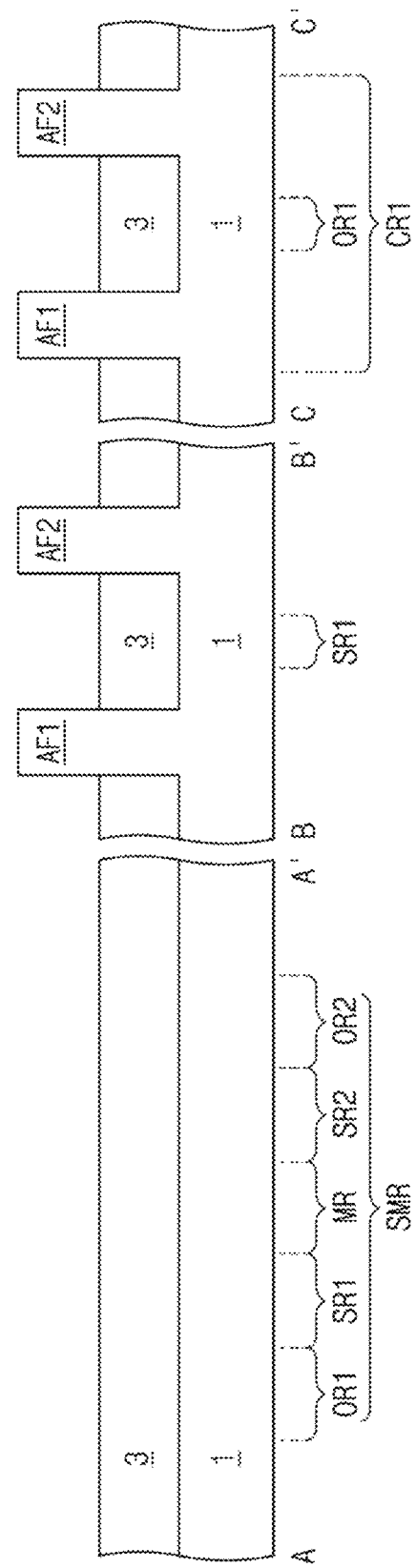

Referring to FIGS. 2A and 2B, a substrate 1 may be prepared. The substrate 1 may be, for example, a single-crystalline silicon (Si) wafer or a silicon-on-insulator (SOI) substrate. Alternatively, the substrate 1 may be a silicon substrate including silicon (Si), for example, single crystalline silicon (Si), polycrystalline silicon (Si), amorphous silicon (Si), or a combination thereof, and/or may include other materials such as silicon germanium (SiGe), silicon germanium on insulator (SGOI), indium antimonide (InSb), a lead tellurium compound (PbTe), gallium phosphide (GaP), indium arsenide (InAs), indium phosphide (InP), gallium arsenide (GaAs), or gallium antimonide (GaSb). The substrate 1 may include a separation mask opening region SMR, a first contact region CR1, and a second contact region CR2. The separation mask opening region SMR may include first and second overlapping regions OR1 and OR2 that respectively overlap the first and second contact regions CR1 and CR2, first and second separation region SR1 and SR2 that are respectively adjacent to the first and second overlapping regions OR1 and OR2, and a middle region MR positioned between the first and second separation regions SR1 and SR2. The substrate 1 may be etched to form a first active fin AF1 and a second active fin AF2. A device isolation layer 3 may be formed on the substrate 1 and may be etched to have a top surface lower than those of the first and second active fins AF1 and AF2. Thus, the device isolation layer 3 may cover the top surface of the substrate 1 and lower lateral surfaces of the first and second active fins AF1 and AF2, and thus may surround and define the first and second active fins AF1 and AF2. When viewed in plan view, each of the first and second active fins AF1 and AF2 may be formed to have a linear shape that extends in a first direction x. The separation mask opening region SMR may be positioned between the first and second active fins AF1 and AF2. Each of the first and second contact regions CR1 and CR2 may have a bar shape that extends in a second direction y, and may intersect the first and second active fins AF1 and AF2.

Figure 3B:
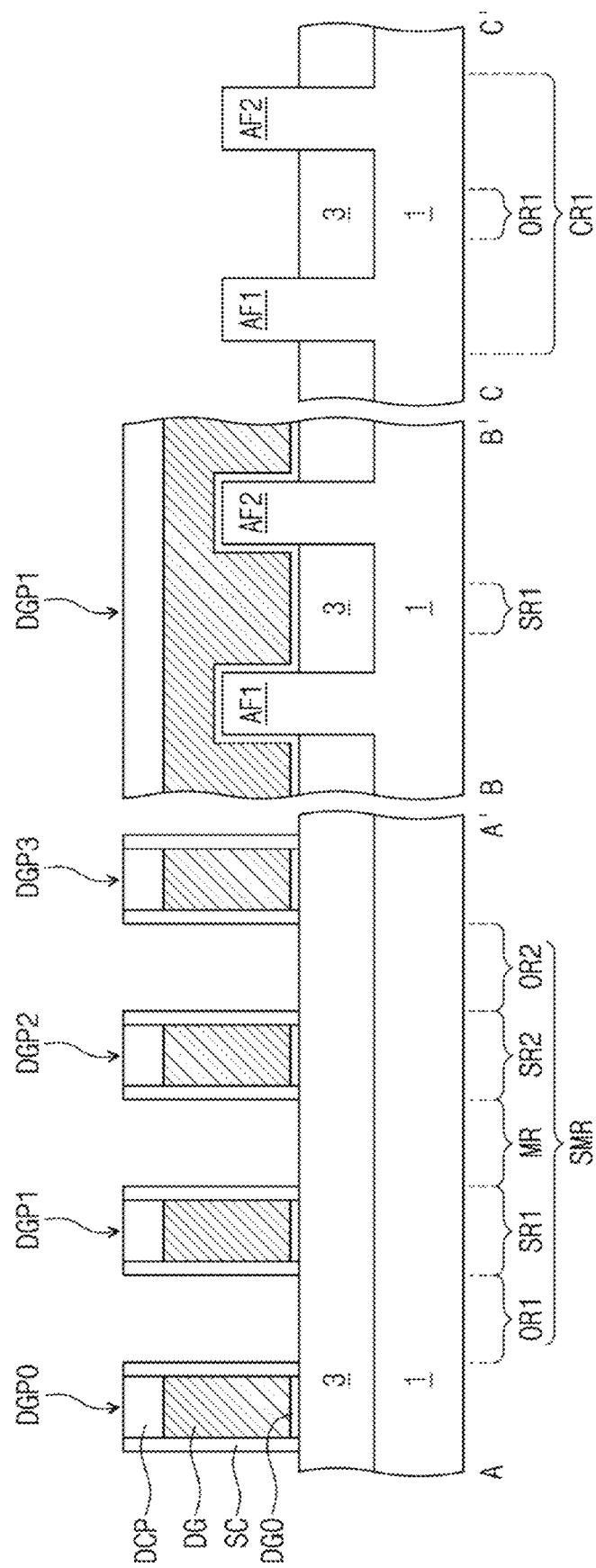

Referring to FIGS. 3A and 3B, a dielectric layer, a conductive layer, and a capping layer may be sequentially formed on the substrate 1 and thereafter may be patterned to form dummy gate patterns DGP0, DGP1, DGP2, and DGP3 each of which includes a dummy gate dielectric layer DGO, a dummy gate electrode DG, and a dummy gate capping pattern DCP that are sequentially stacked. Each of the dummy gate patterns DGP0, DGP1, DGP2, and DGP3 may have a linear shape that extends in the second direction y to cross over the first and second active fins AF1 and AF2. The dummy gate dielectric layer DGO may include, for example, a silicon oxide ($SiO_2$) layer. The dummy gate electrode DG may include, for example, a polysilicon (p-Si) layer. The dummy gate capping pattern DCP may include, for example, a silicon nitride ($Si_3N_4$) layer. Spacers SC may be formed to cover corresponding sidewalls of the dummy gate patterns DGP0, DGP1, DGP2, and DGP3. Each of the spacers SC may have a single-layered or multi-layered structure including one or more selected from, for example, a silicon oxide ($SiO_2$) layer, a silicon nitride ($Si_3N_4$) layer, and a silicon oxynitride (SiON) layer. The first and second active fins AF1 and AF2 may be exposed at their top surfaces and upper sidewalls on sides of the spacers SC between the dummy gate patterns DGP0, DGP1, DGP2, and DGP3. The dummy gate patterns DGP0, DGP1, DGP2, and DGP3 may intersect the first and second active fins AF1 and AF2 to cover the top surfaces and upper sidewalls of the first and second active fins AF1 and AF2.

Figure 4B:
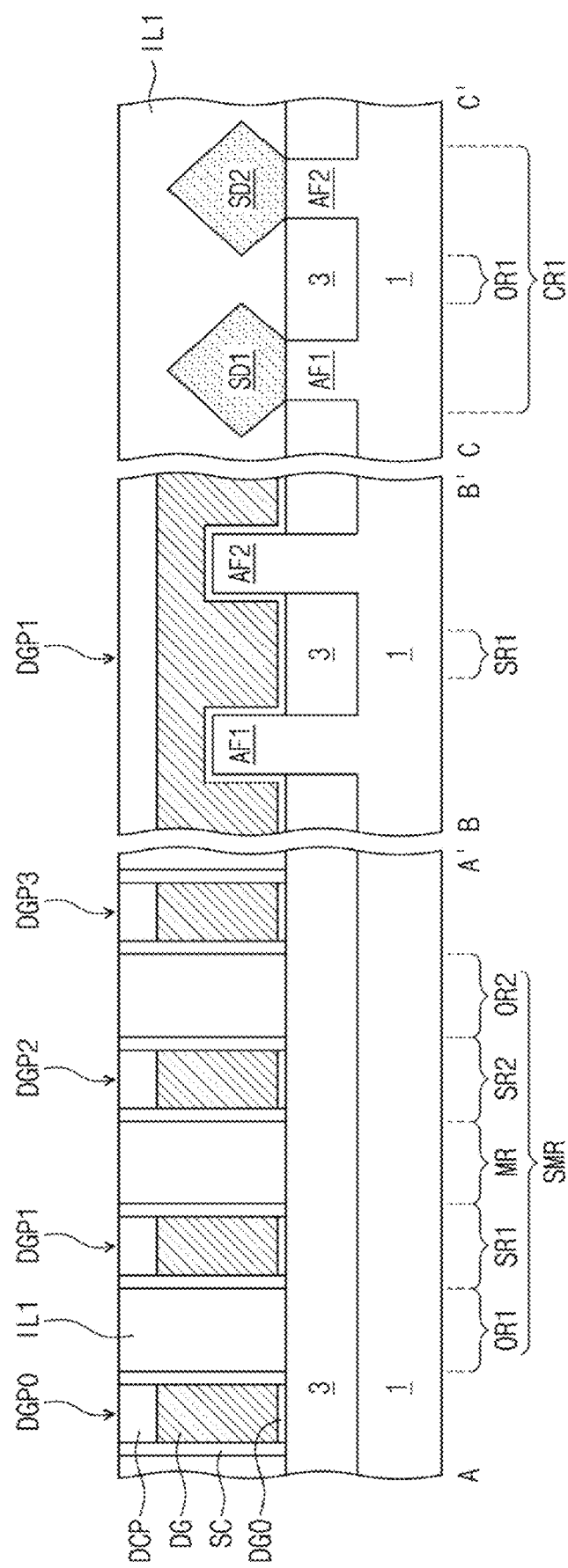
Figure 5A:
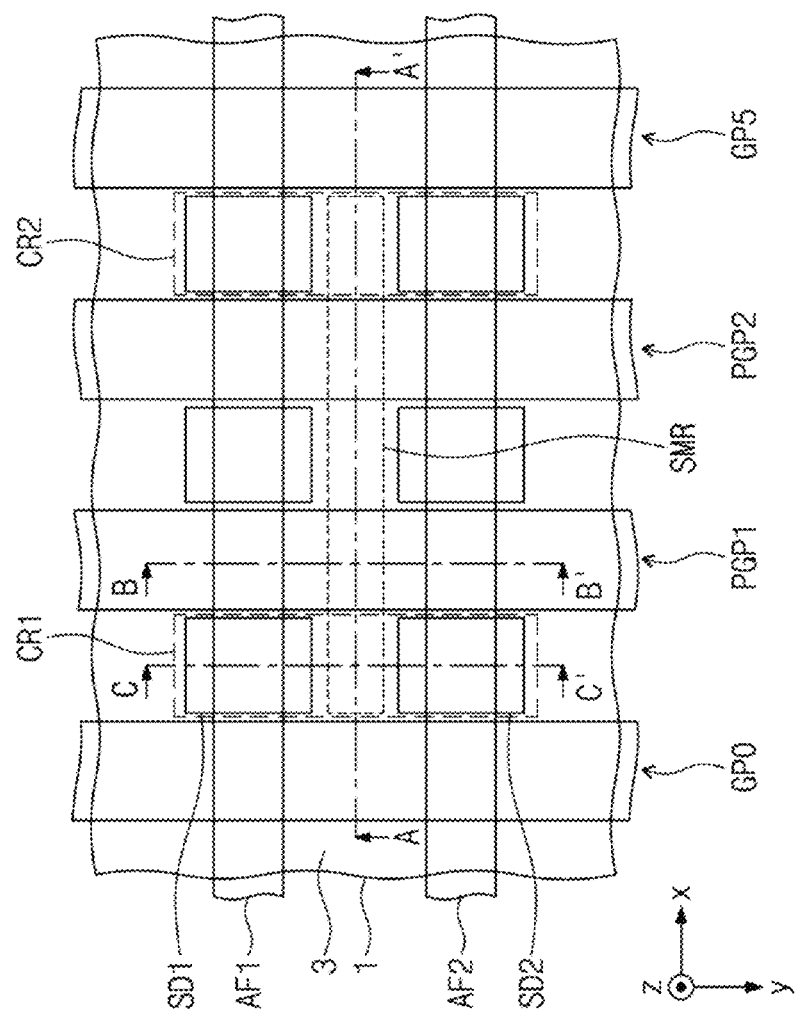
Figure 5B:
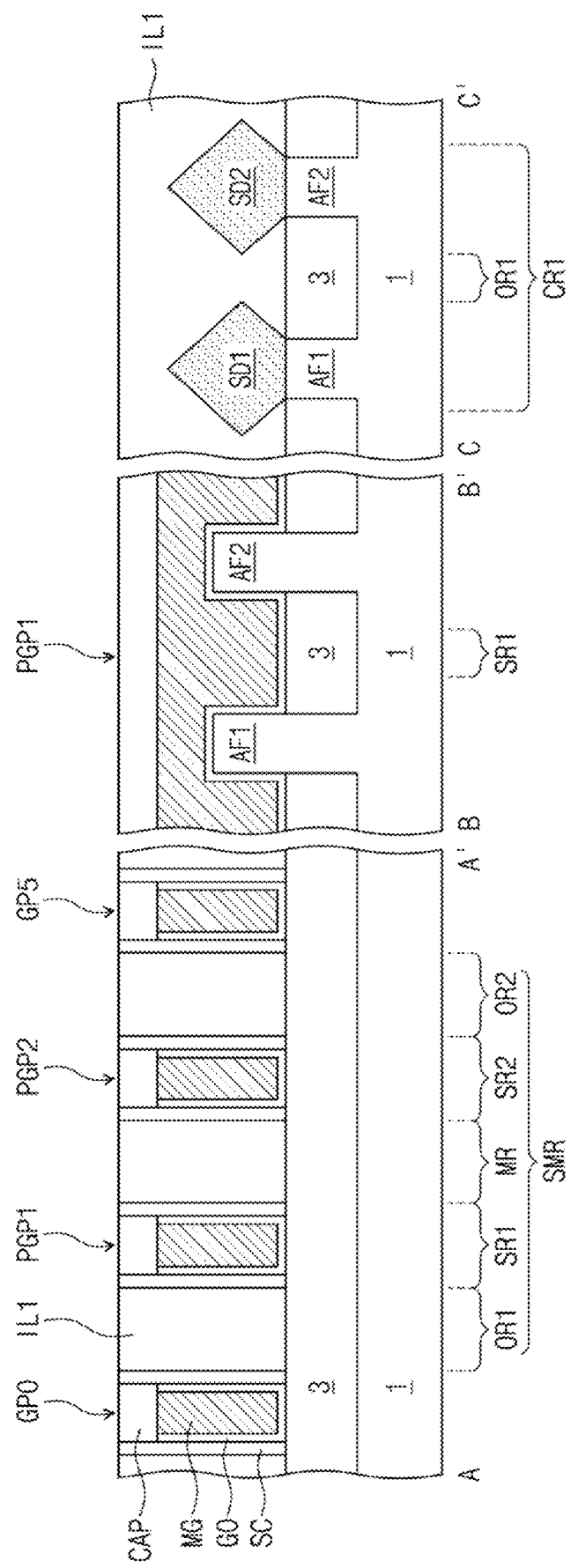

Referring to FIGS. 4A and 4B, upper portions of the first and second active fins AF1 and AF2 exposed between the dummy gate patterns DGP0, DGP1, DGP2, and DGP3 may be removed to reduce heights of the top surfaces of the first and second active fins AF1 and AF2. The first and second active fins AF1 and AF2 may thus have their top surfaces at heights similar to that of the top surface of the device isolation layer 3. A selective epitaxial growth (SEG) process may be performed to form first and second source/drain patterns SD1 and SD2, respectively, on the first and second active fins AF1 and AF2. The first and second source/drain patterns SD1 and SD2 may have a pentagonal shape, but the present inventive concept is not limited thereto. The first and second source/drain patterns SD1 and SD2 may each include a semiconducting material selected from one of, for example, silicon (Si), germanium (Ge), silicon germanium (SiGe), silicon carbide (SiC), gallium arsenide (GaAs), etc. The first and second source/drain patterns SD1 and SD2 may be doped with impurities whose conductivity types are the same or different from each other. For example, the first and second source/drain patterns SD1 and SD2 may be doped with n-type impurities or p-type impurities during the SEG process, or may be separately doped with the n-type impurities or the p-type impurities through an ion implantation process. A first interlayer dielectric layer IL1 may be formed on the substrate 1, and a chemical mechanical polishing (CMP) process or an etch-back process may be performed to expose top surfaces of the dummy gate patterns DGP0, DGP1, DGP2, and DGP3. The first interlayer dielectric layer IL1 may thus have a top surface coplanar with those of the dummy gate patterns DGP0, DGP1, DGP2, and DGP3. The dummy gate patterns DGP0, DGP1, DGP2, and DGP3 may be classified into a zeroth dummy gate pattern DGP0, a first dummy gate pattern DGP1, a second dummy gate pattern DGP2, and a third dummy gate pattern DGP3.

Referring to FIGS. 4A, 4B, 5A, and 5B, the dummy gate patterns DGP0, DGP1, DGP2, and DGP3 may be removed to expose inner sidewalls of the spacers SC, the device isolation layer 3 between the exposed inner sidewalls of the spacers SC, and the top surfaces and the upper sidewalls of the active fins AF1 and AF2 between the exposed inner sidewalls of the spacers SC. A dielectric layer may be conformally formed on the substrate 1 such that the dielectric layer may cover the inner sidewalls of the spacers SC, the device isolation layer 3 between the exposed sidewalls of the spacers SC, and the top surfaces and the upper sidewalls of the active fins AF1 and AF2 between the exposed sidewalls of the spacers SC. A conductive layer may be formed to fill spaces between the spacers SC, and thereafter, an etch-back process may be performed on the conductive layer and the dielectric layer. Thus, a gate dielectric layer GO and a gate electrode MG may be formed between the spacers SC. A gate capping layer may be formed, and then an etch-back process may be performed to form a gate capping pattern CAP on the gate dielectric layer GO and the gate electrode MG. The materials used to form the gate capping pattern CAP, the gate dielectric layer GO and the gate electrode MG may be the same as those described above with reference to FIGS. 1A through 1C. Therefore, the zeroth dummy gate pattern DGP0 may be changed into a zeroth gate pattern GP0, and the third dummy gate pattern DGP3 may be changed into a fifth gate pattern GP5. The first dummy gate pattern DGP1 may be changed into a first preliminary gate pattern PGP1, and the second dummy gate pattern DGP2 may be changed into a second preliminary gate pattern PGP2. The zeroth gate pattern GP0, the first preliminary gate pattern PGP1, the second preliminary gate pattern PGP2, and the fifth gate pattern GP5 may have the same structure.

Referring to FIGS. 5A, 5B, 6A, and 6B, a separation mask pattern SM may be formed on the first interlayer dielectric layer IL1. The separation mask pattern SM may be formed by a photolithography process. The separation mask pattern SM may include a separation mask opening SMO. The separation mask opening SMO may be positioned coincident with the separation mask opening region SMR.

The separation mask opening SMO may be formed to run across the first and second preliminary gate patterns PGP1 and PGP2. The separation mask opening SMO may expose the first and second preliminary gate patterns PGP1 and PGP2 on the first and second separation regions SR1 and SR2, and also expose a portion of the first interlayer dielectric layer IL1 on sides of the first and second preliminary gate patterns PGP1 and PGP2. The separation mask pattern SM may cover the zeroth and fifth gate patterns GP0 and GP5.

An etching process, such as isotropic/anisotropic etching, may be performed to remove the first and second preliminary gate patterns PGP1 and PGP2 that are exposed to the separation mask opening SMO. In this case, the first interlayer dielectric layer IL1 may also be partially etched. Since the zeroth and fifth gate patterns GP0 and GP5 are covered by the separation mask pattern SM, they may not be etched during the etching process. A separation trench ST may therefore be formed to expose the device isolation layer 3 on the first and second separation regions SR1 and SR2. The first interlayer dielectric layer IL1 may partially remain on the first and second overlapping regions OR1 and OR2 and the middle region MR. For example, portions of the first and second preliminary gate patterns PGP1 and PGP2 on the first and second separation regions SR1 and SR2 may be completely removed. Due to etch rate difference, the first interlayer dielectric layer IL1 on the first and second overlapping regions OR1 and OR2 and the middle region MR may not be completely etched. A bottom surface of the separation trench ST may have an uneven structure. The separation trench ST may cause the zeroth and fifth gate patterns GP0 and GP5 to have their sidewalls that are not exposed but covered with a portion of the first interlayer dielectric layer IL1. The portion of the first interlayer dielectric layer IL1 covering the sidewalls of the zeroth and fifth gate patterns GP0 and GP5 may be positioned at an area not exposed by the separation mask opening SMO, and thus may not be etched during the formation of the separation trench ST.

Because the first and second preliminary gate patterns PGP1 and PGP2 are removed from the first and second separation regions SR1 and SR2, the first preliminary gate pattern PGP1 may be divided into first and second gate patterns GP1 and GP2 that are spaced apart from each other in the second direction y, and the second preliminary gate pattern PGP2 may be divided into third and fourth gate patterns GP3 and GP4 that are spaced apart from each other in the second direction y. The separation mask pattern SM may be removed to expose the first interlayer dielectric layer IL1. For example, a gate-cutting process may be applied here to separate the first preliminary gate pattern PGP1 into the first and second gate patterns GP1 and GP2, and to separate the second preliminary gate pattern PGP2 into the third and fourth gate patterns GP3 and GP4.

In consideration of process margin due to misalignment, the separation mask opening SMO may be formed not only on the first and second separation regions SR1 and SR2, but also on the first and second overlapping regions OR1 and OR2 and the middle region MR. Even though misalignment is slightly produced, the first and second preliminary gate patterns PGP1 and PGP2 may be exposed on the first and second separation regions SR1 and SR2 of the substrate 1. For example, the first and second preliminary gate patterns PGP1 and PGP2 may be completely removed to reach the device isolation layer 3 in the separation trench ST. Accordingly, the first and second gate patterns GP1 and GP2 may be completely separated by the separation trench ST on the first separation region SR1. Also, the third and fourth gate patterns GP3 and GP4 may be completely separated by the separation trench ST on the second separation region SR2. As a result, it may be possible to prevent gate-bridge where the first and second gate patterns GP1 and GP2 are partially connected to each other or the third and fourth gate patterns GP3 and GP4 are partially connected to each other.

Figure 7A:
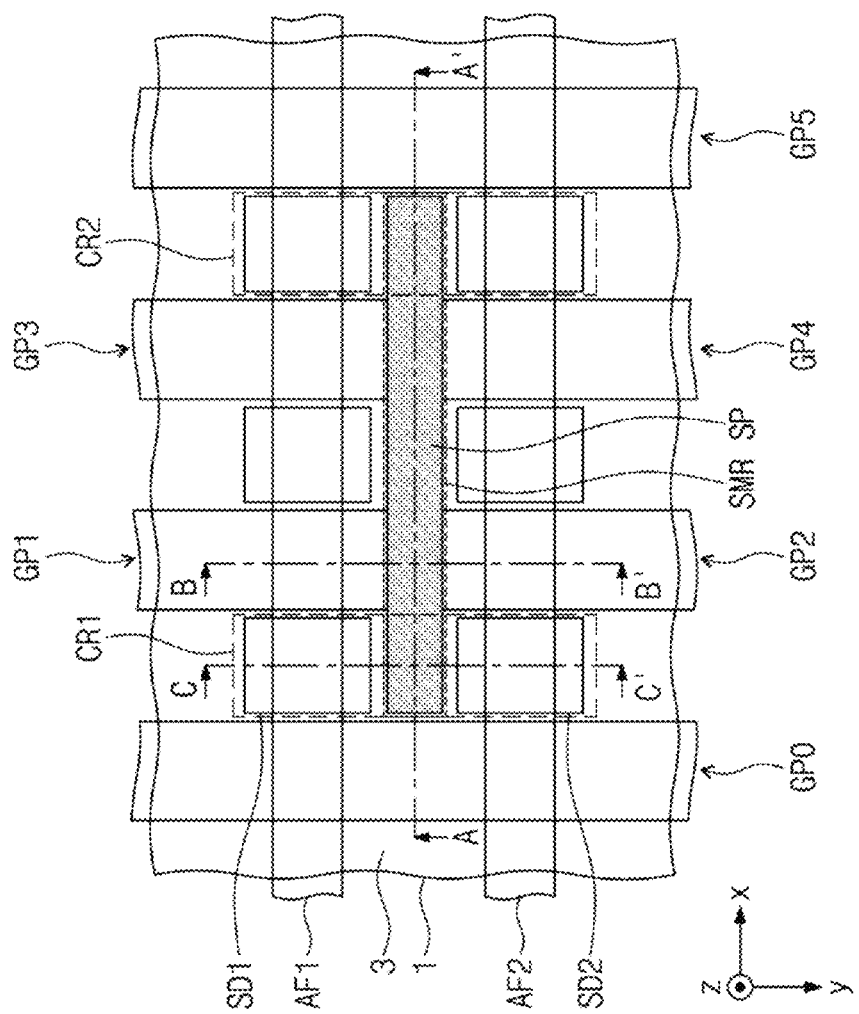
Figure 7B:
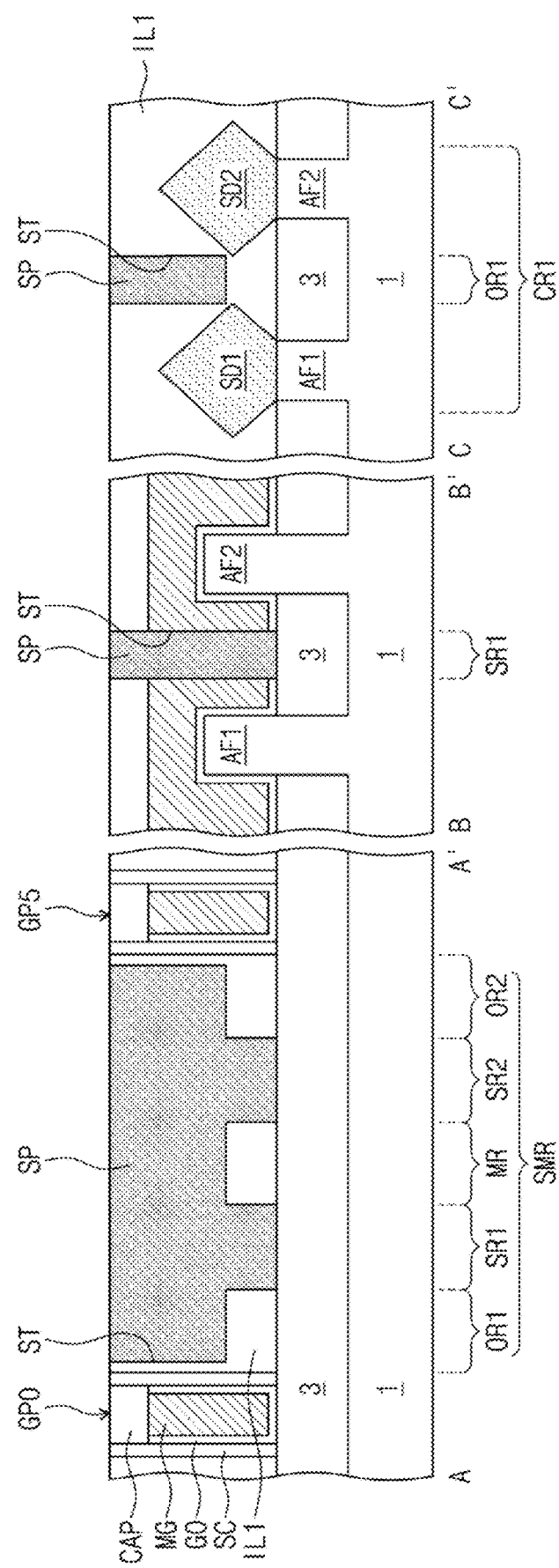

Referring to FIGS. 7A and 7B, a dielectric layer may be formed on the substrate 1 to fill the separation trench ST, and then an etch-back process may be performed to form a separation pattern SP in the separation trench ST and simultaneously to expose the top surface of the first interlayer dielectric layer IL1. Thus, the separation pattern SP may have a top surface coplanar with that of the first interlayer dielectric layer IL1. A bottom surface of the separation pattern SP may have an uneven structure, and may be in contact with the device isolation layer 3 on the first and second separation regions SR1 and SR2 of the substrate 1. The separation pattern SP may be formed of a material, such as silicon nitride ($Si_3N_4$), having an etch selectivity with respect to a material of the first interlayer dielectric layer IL1.

Figure 8A:
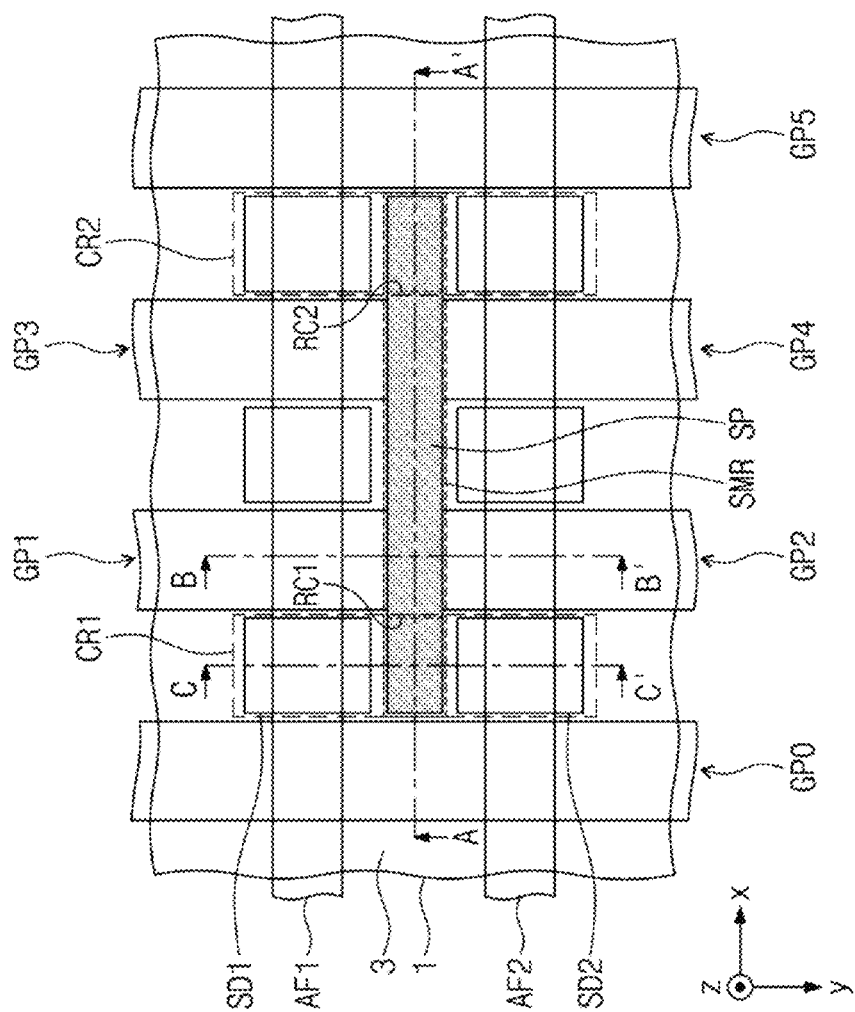
Figure 8B:
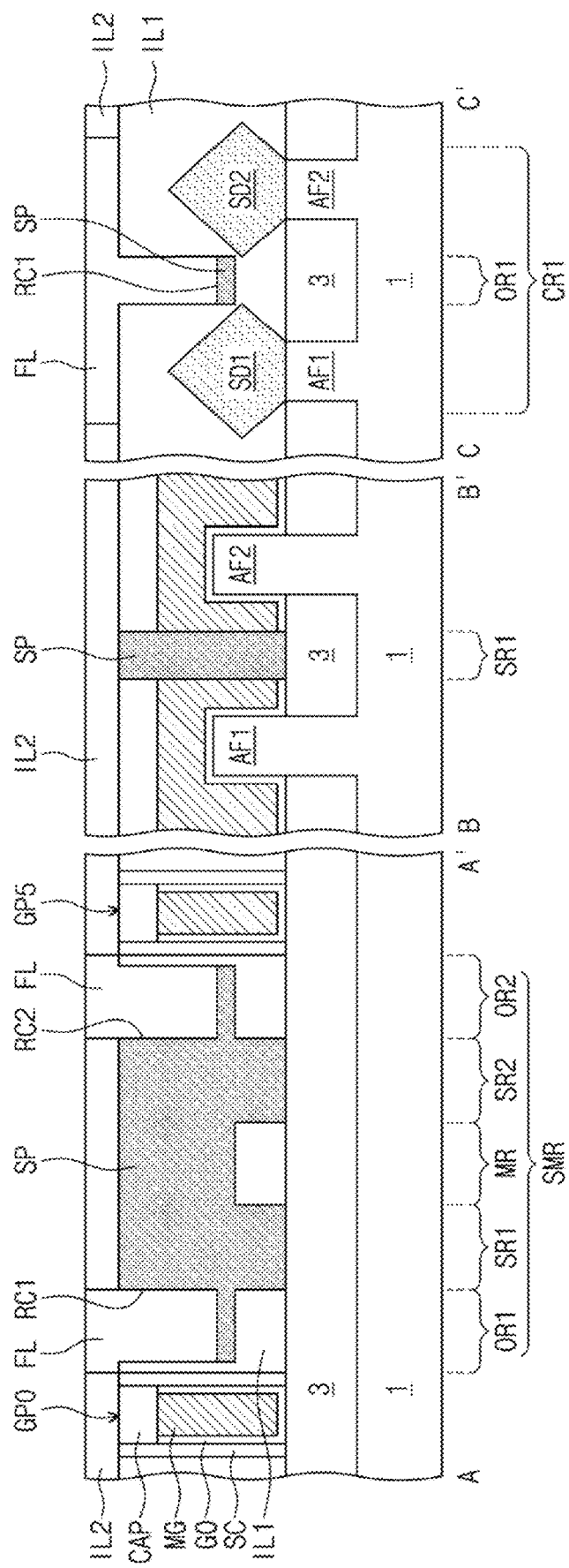

Referring to FIGS. 8A and 8B, a second interlayer dielectric layer IL2 may be formed on the substrate 1 on which the separation pattern SP is formed. The second interlayer dielectric layer IL2 may include a material, such as silicon oxide ($SiO_2$), having an etch selectivity with respect to a material of the separation pattern SP. A mask pattern may be separately formed on the second interlayer dielectric layer IL2, and the mask pattern may be used to etch the second interlayer dielectric layer IL2. At least a portion of the separation pattern SP may be removed from the first and second overlapping regions OR1 and OR2, and thus first and second recesses RC1 and RC2 may be formed on the separation pattern SP. The separation pattern SP may partially remain on bottom surfaces of the first and second recesses RC1 and RC2. A buried dielectric layer may be formed to fill the first and second recesses RC1 and RC2, and then an etch-back process may be performed to expose a top surface of the second interlayer dielectric layer IL2 and simultaneously to form buried dielectric patterns FL in the first and second recesses RC1 and RC2. The buried dielectric patterns FL may be formed of a material, such as silicon oxide ($SiO_2$), the same as or similar to that of the first interlayer dielectric layer IL1.

A mask pattern may be separately formed on the second interlayer dielectric layer IL2 and the buried dielectric patterns FL, and the mask pattern may be used to etch the buried dielectric patterns FL and the first interlayer dielectric layer IL1. Subsequently, referring to FIGS. 1A and 1B, on the first and second overlapping regions OR1 and OR2, the buried dielectric patterns FL and the first interlayer dielectric layer IL1 may be etched to form contact holes CH. In this case, upper portions of the source/drain patterns SD1 and SD2 may also be removed. A conductive layer may be formed on an entire surface of the substrate 1 so as to fill the contact holes CH, and then an etch-back process or a chemical mechanical polishing (CMP) process may be performed to form contact plugs CT1 and CT2. A semiconductor device may thus be fabricated as shown in FIGS. 1A and 1B.

In a method of fabricating a semiconductor device according to an example embodiment of the present inventive concept, at least a portion of the separation pattern SP may be previously removed to form the recesses RC1 and RC2 on the overlapping regions OR1 and OR2, and the recesses RC1 and RC2 may be filled with the buried dielectric patterns FL including a material identical or similar to that of the first interlayer dielectric layer IL1, which may solve issues associated with etching difficulty in forming the contact holes CH.

When at least a portion of the separation pattern SP is not previously removed from the overlapping regions OR1 and OR2, the separation pattern SP may be present on the overlapping regions OR1 and OR2 when the contact holes CH are formed, with the result that the contact plugs CT1 and CT2 may each be disconnected. In this case, each of the contact plugs CT1 and CT2 may not connect the first and second source/drain patterns SD1 and SD2, which may result in the occurrence of process defects such as contact-connection failure. In contrast, according to the present inventive concept, because at least a portion of the separation pattern SP is previously removed from the overlapping regions OR1 and OR2, it may be possible to avoid the problems mentioned above and to increase yield. However, if the portion of the separation pattern SP removed from the overlapping regions OR1 and OR2 is too small, each of the contact plugs CT1 and CT2 may not connect or may weakly connect the first and second source/drain patterns SD1 and SD2. It is desirable to have sufficient amount of the separation pattern SP removed from the overlapping regions OR1 and OR2 to increase yield. For example, in an example embodiment of the present inventive concept, the separation pattern SP may be removed from the first and second overlapping regions OR1 and OR2 to an extent that at least the lowermost portions of the first and second recesses RC1 and RC2 are lower than the uppermost portions of the first and second source/drain patterns SD1 and SD2. Thus, even some portion of the separation pattern SP may be present on the first and second overlapping regions OR1 and OR2, the first and second contact plugs CT1 and CT2 formed in the contact holes CH which include upper portions of the source/drain patterns SD1 and SD2 removed may each be connected to the first and second source/drain patterns SD1 and SD2. Accordingly, the contact-connection failure on the overlapping regions OR1 and OR2 may be prevented, and reliability of the semiconductor device may increase.

Figure 9A:
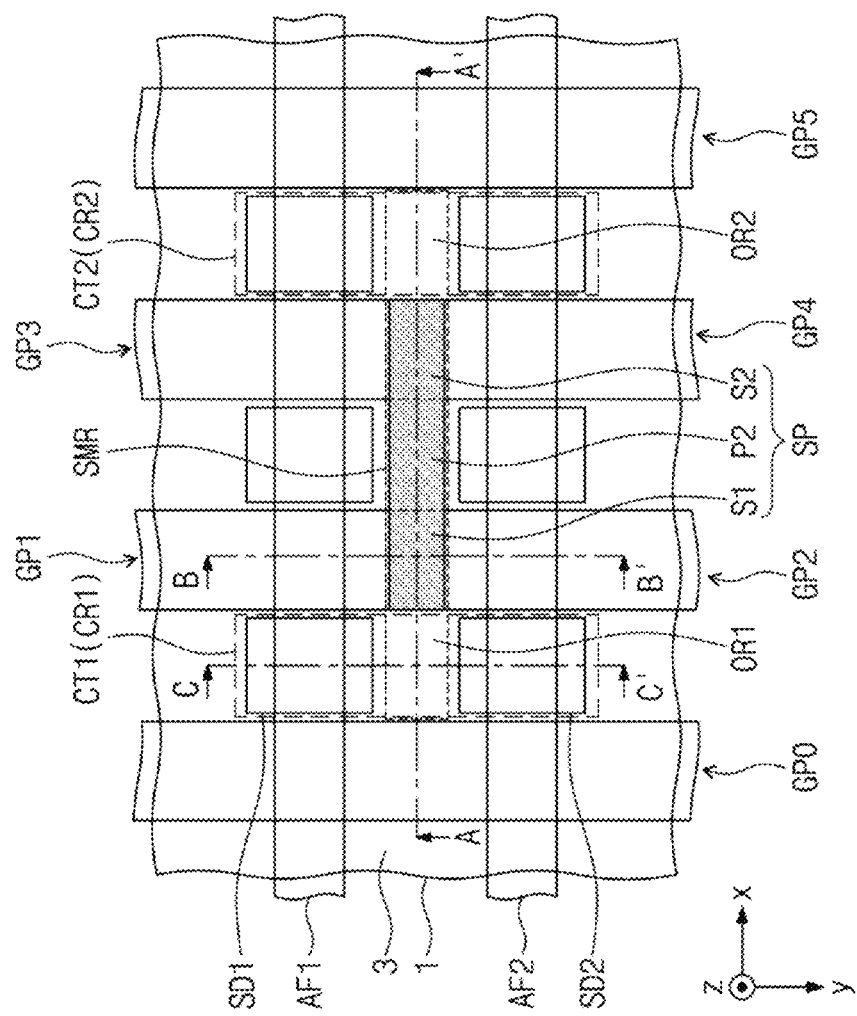
FIG. 9A illustrates a plan view showing a semiconductor device according to an example embodiment of the present inventive concept.
Figure 9B:
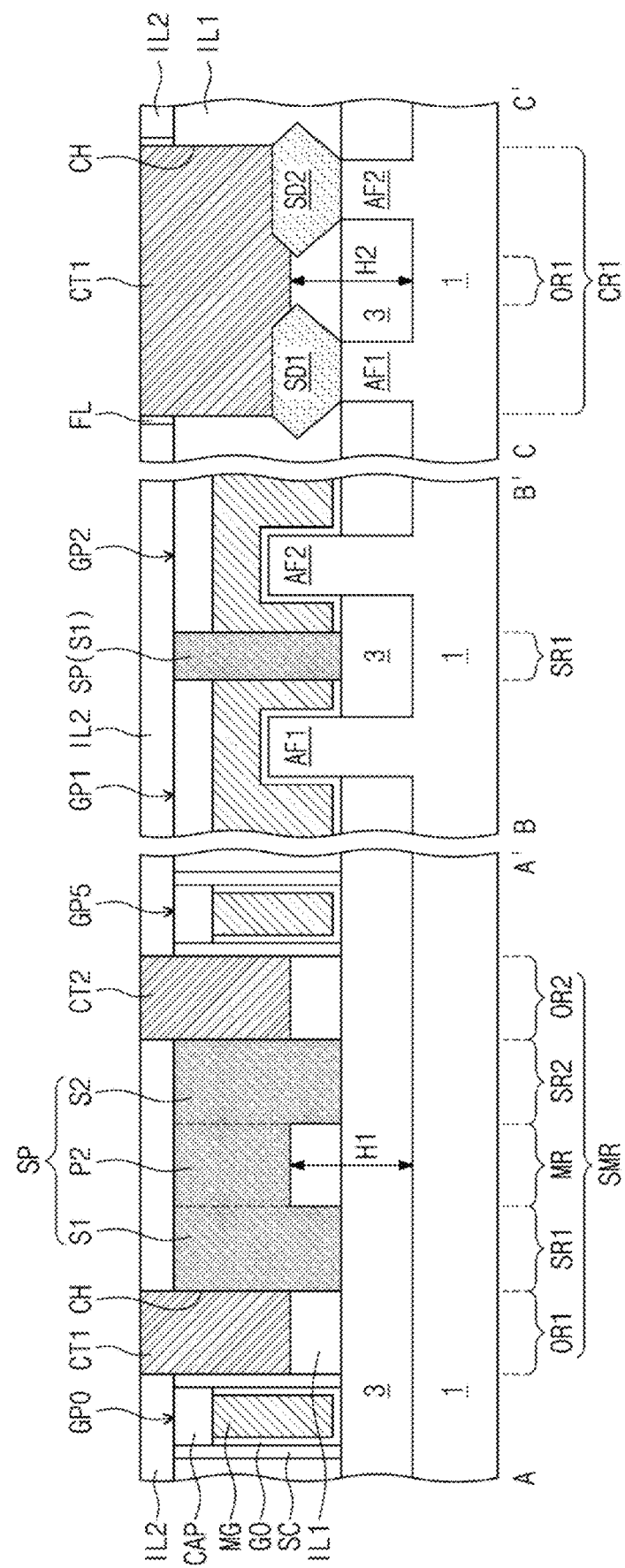
FIG. 9B illustrates a cross-sectional view taken along lines A-A', B-B', and C-C' of FIG. 9A, according to an example embodiment of the present inventive concept.

FIG. 9A illustrates a plan view showing a semiconductor device according to an example embodiment of the present inventive concept. FIG. 9B illustrates a cross-sectional view taken along lines A-A', B-B', and C-C' of FIG. 9A, according to an example embodiment of the present inventive concept.

Referring to FIGS. 9A and 9B, a semiconductor device according to the present example embodiment may be configured such that the separation pattern SP may not include the first protrusion segment P1 and the third protrusion segment P3 that are shown in FIGS. 1A and 1B. For example, in the process of forming the first and second recesses RC1 and RC2, the separation pattern SP may not remain on the bottom surfaces of the first and second recesses RC1 and RC2, or in the process of forming the contact holes CH, the first protrusion segment P1 and the third protrusion segment P3 may be removed. The separation pattern SP may include the first separation segment S1, the second separation segment S2, and the second protrusion segment P2 that connects the first and second separation segments S1 and S2. The first and second separation segments S1 and S2 may have their bottom surfaces in direct contact with the device isolation layer 3. Thus, no gate-bridges may be formed on the separation regions SR1 and SR2. The contact plugs CT1 and CT2 may have their bottom surfaces in direct contact with the first interlayer dielectric layer IL1. The separation pattern SP may be absent on the overlapping regions OR1 and OR2 of the substrate 1. As shown in the cross-sectional view taken along line C-C' of FIG. 9B, the bottom surface of the first contact plug CT1 may have an uneven structure. For example, a portion of the first contact plug CT1 may protrude downwardly between the first and second source/drain patterns SD1 and SD2. The bottom surface of the second contact plug CT2 may also have an uneven structure. A lowermost end of the bottom surface of the first contact plug CT1 may have a height H2 the same as a height H1 of a bottom surface of the second protrusion segment P2, in which heights H1 and H2 are measured in the third direction z from the top surface of the substrate 1. Other configurations may be identical or similar to those discussed with reference to FIGS. 1A to 1C.

The semiconductor device of FIGS. 9A and 9B may be fabricated by completely removing the separation pattern SP from the overlapping regions OR1 and OR2 when the separation pattern SP is etched as illustrated in FIGS. 8A and 8B, and then performing subsequent processes. Moreover, the contact hole CH may be formed to have a bottom surface that is crooked due to a difference in etch rate between the first interlayer dielectric layer IL1 and the source/drain patterns SD1 and SD2. Therefore, the first contact plug CT1 may be altered in shape. With the altered shape, the first contact plug CT1 may have larger contact area with the source/drain patterns SD1 and SD2, and thus may be less likely to have contact-connection failure. Other process steps may be identical or similar to those discussed above.

Figure 10:
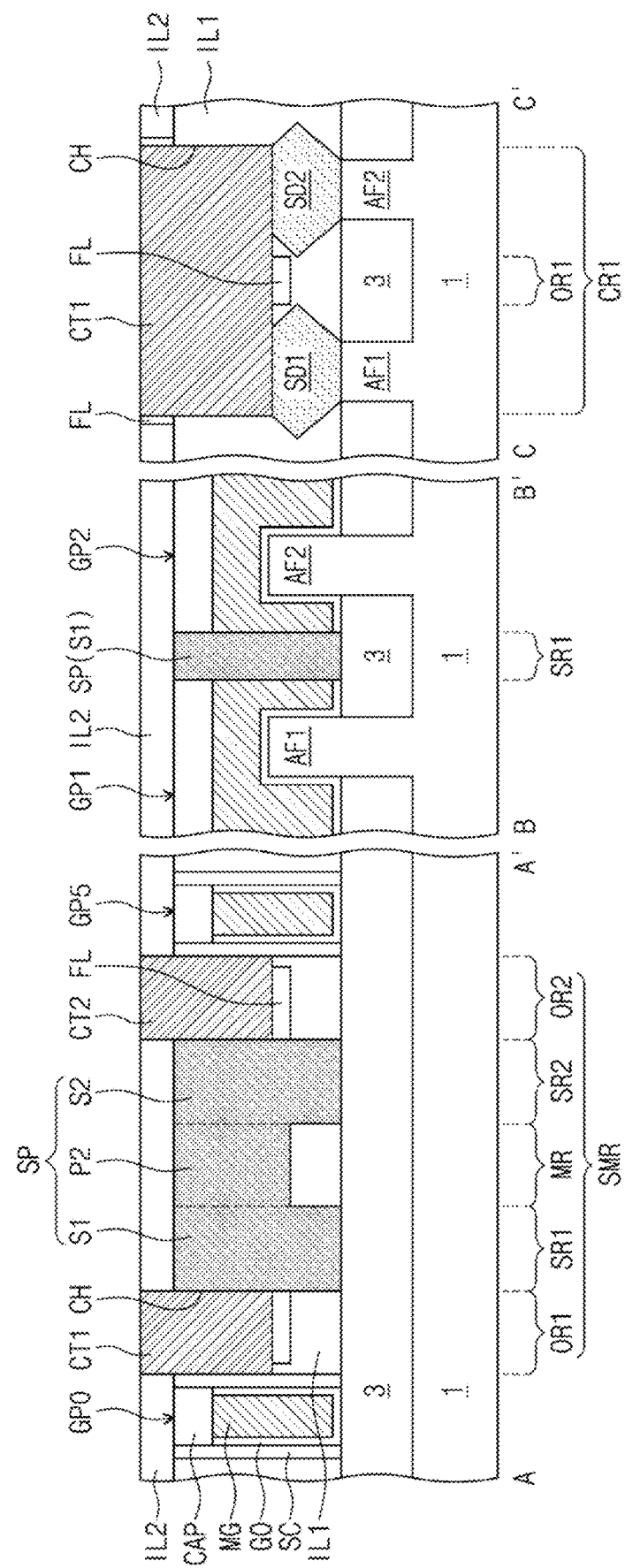
FIG. 10 illustrates a cross-sectional view taken along lines A-A', B-B', and C-C' of FIG. 9A, according to an example embodiment of the present inventive concept.

FIG. 10 illustrates a cross-sectional view taken along lines A-A', B-B', and C-C' of FIG. 9A, according to an example embodiment of the present inventive concept.

Referring to FIGS. 9A and 10, a semiconductor device according to the present example embodiment may not include the first protrusion segment P1 and the third protrusion segment P3 that are shown in FIGS. 1A and 1B. The buried dielectric patterns FL may remain below the contact plugs CT1 and CT2 on the overlapping regions OR1 and OR2. The buried dielectric patterns FL may be in direct contact with bottom surfaces of the contact plugs CT1 and CT2. Other configurations may be identical or similar to those discussed with reference to FIGS. 1A to 1C.

The semiconductor device of FIG. 10 may be fabricated by completely removing the separation pattern SP from the overlapping regions OR1 and OR2 when the separation pattern SP is etched as shown in FIGS. 8A and 8B, partially leaving the buried dielectric pattern FL on a bottom surface of the contact hole CH when the contact hole CH is formed, and then performing subsequent processes. Other process steps may be identical or similar to those discussed above. With the processes described above, the first interlayer dielectric layer IL1 may be disposed between the first contact plug CT1 and the device isolation layer 3 over the substrate 1, between the second contact plug CT2 and the device isolation layer 3 over the substrate 1, and between the second protrusion segment P2 and the device isolation layer 3 over the substrate 1. A different interlayer dielectric layer may be formed to replace the first interlayer dielectric layer IL1 in these areas. In an example embodiment of the present inventive concept, the second protrusion segment P2 may be adjacent to one sidewall of the first gate pattern GP1, the first contact plug CT1 may be adjacent to another sidewall of the first gate pattern GP1 and spaced apart from the second protrusion segment P2, a third interlayer dielectric layer may be disposed between the second protrusion segment P2 and the substrate 1 and between the first contact plug CT1 and the substrate 1, and the buried dielectric pattern FL may be disposed between the first contact plug CT1 and the third interlayer dielectric layer, in which the bottom surface of the buried dielectric pattern FL may be at a height the same as a height of a bottom surface of the second protrusion segment P2. The third interlayer dielectric layer may be replaced with the first interlayer dielectric layer IL1, or may contain a material different from that of the first interlayer dielectric layer IL1.

The following will describe a method of fabricating the semiconductor device of FIG. 9B or FIG. 10.

FIGS. 11A to 11E illustrate cross-sectional views showing a method of fabricating the semiconductor device of FIG. 9B or FIG. 10.

Figure 6A:
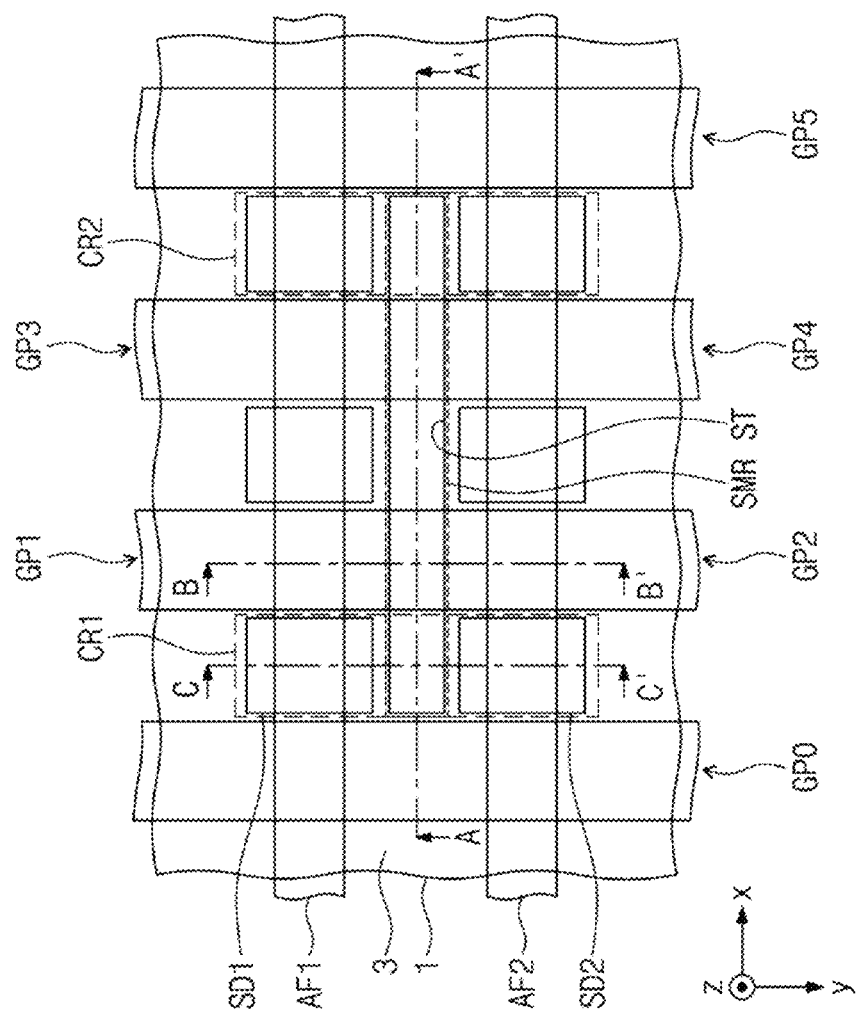
Figure 6B:
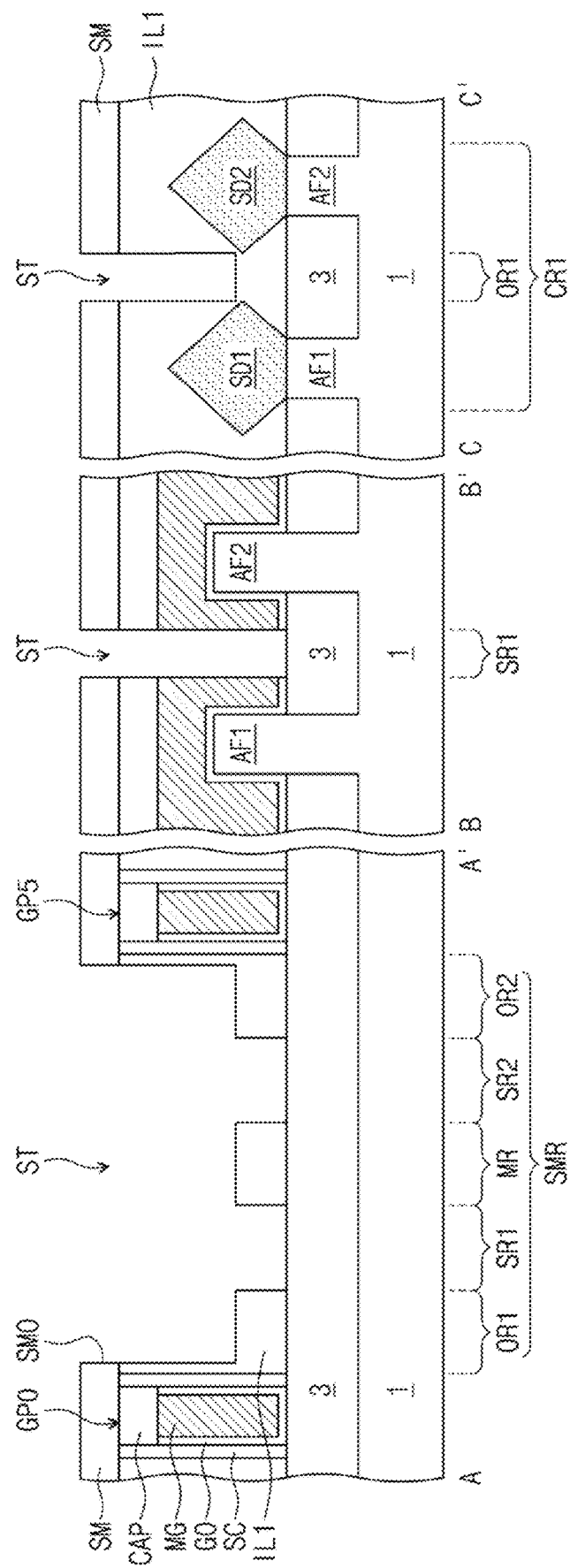
Figure 11A:
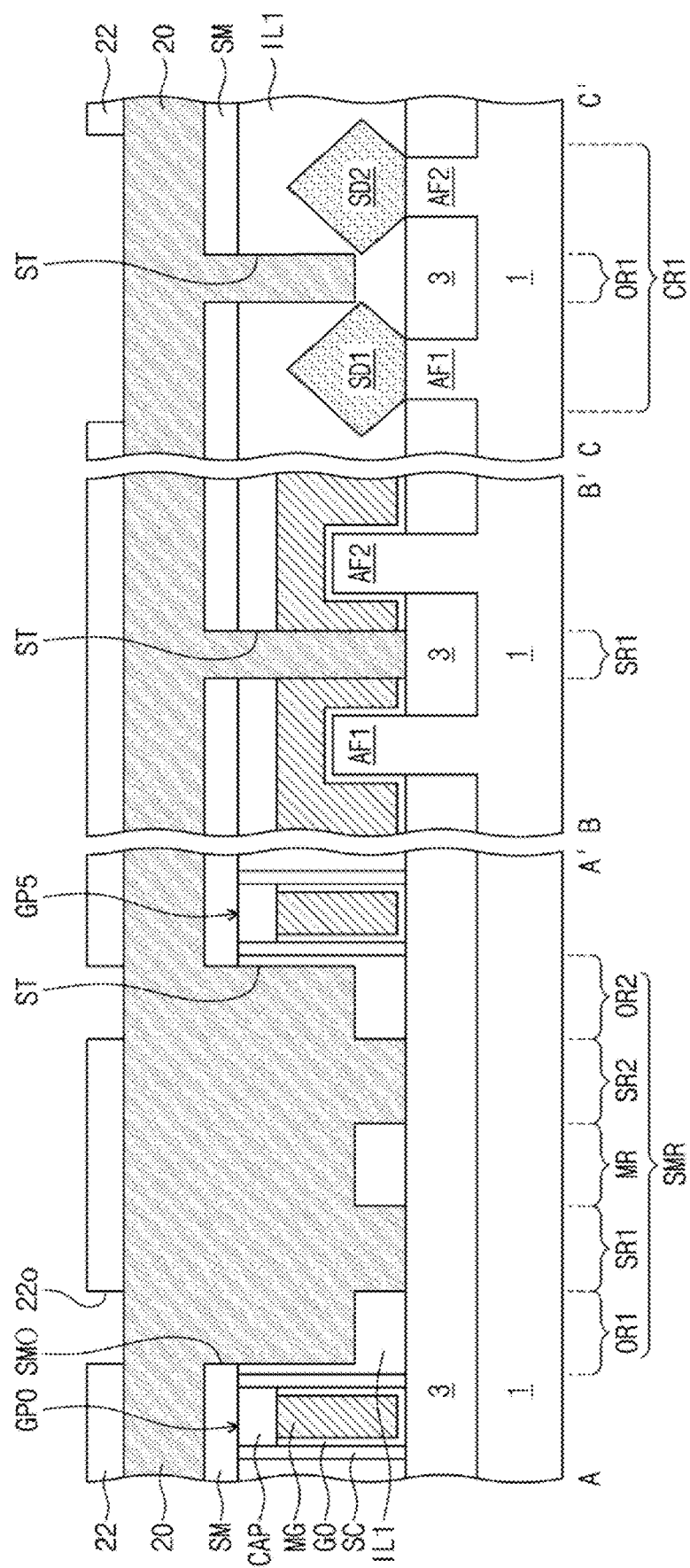
FIGS. 11A to 11E illustrate cross-sectional views showing a method of fabricating the semiconductor device of FIG. 9B or 10.

Referring to FIG. 11A, a sacrificial layer 20 may be formed on the entire surface of the substrate 1 in the state of FIG. 6B, with the result that the sacrificial layer 20 may fill the separation trench ST. The sacrificial layer 20 may be, for example, a spin-on-hardmask (SOH) layer or a spin-on-carbon (SOC) layer. A first mask pattern 22 may be formed on the sacrificial layer 20, and may have openings 22o that overlap the overlapping regions OR1 and OR2.

Figure 11B:
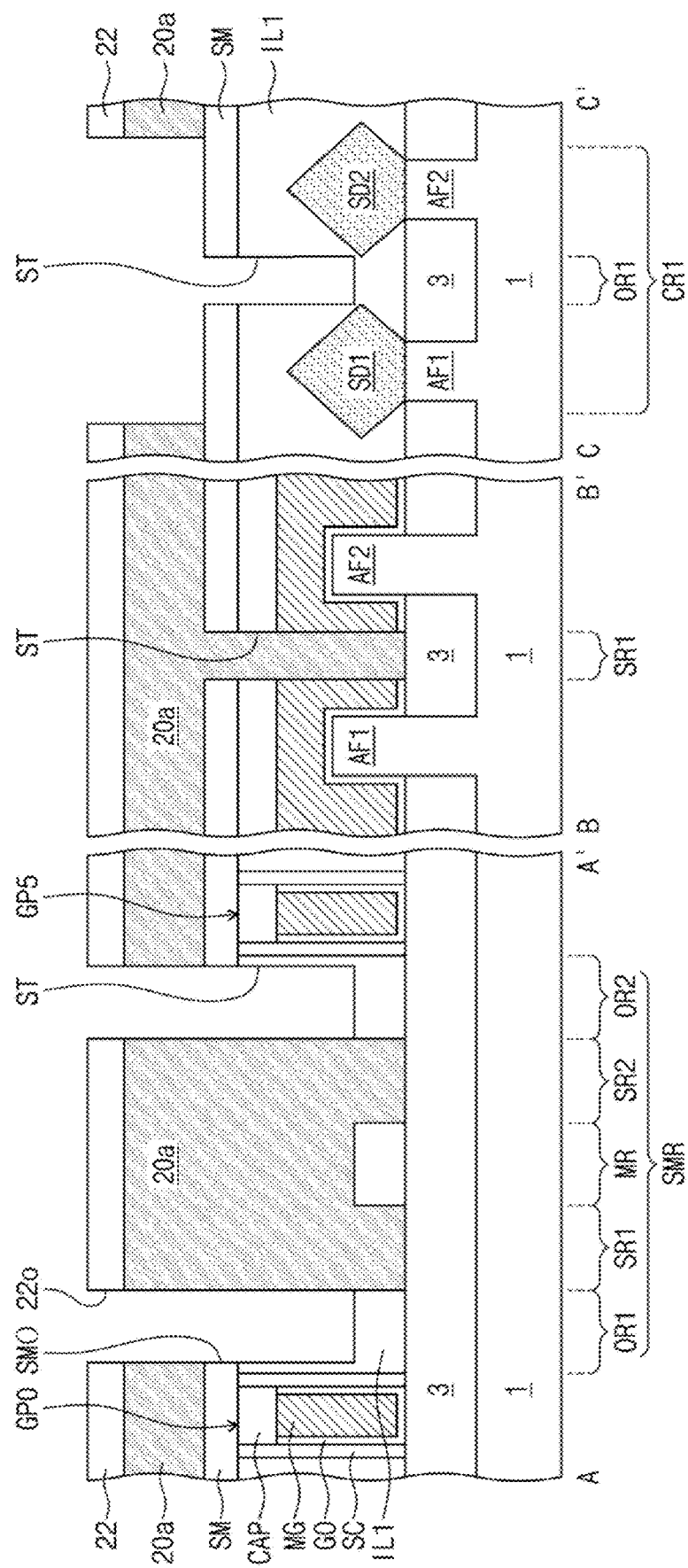

Referring to FIG. 11B, the first mask pattern 22 may be used as an etching mask to etch the sacrificial layer 20, such that the sacrificial layer 20 may be removed from the overlapping regions OR1 and OR2 and a sacrificial pattern 20a may be formed. In the separation trench ST, the sacrificial pattern 20a may be positioned on the separation regions SR1 and SR2 and the middle region MR.

Figure 11C:
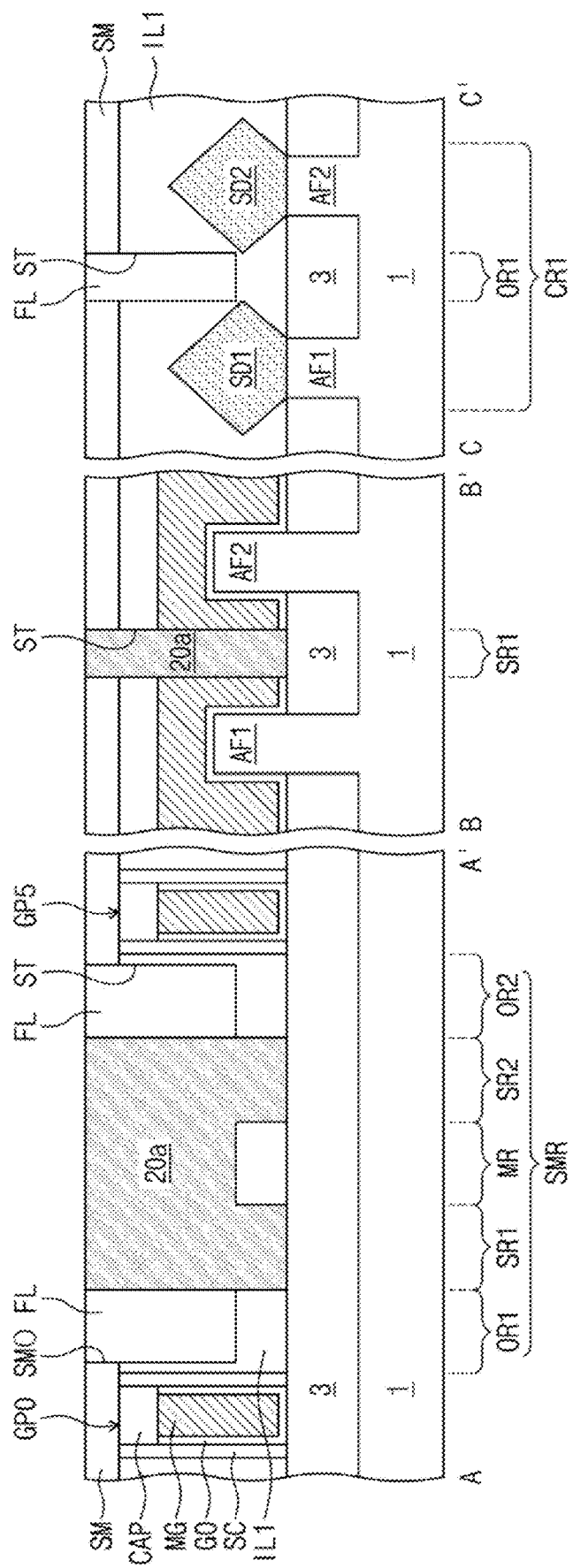

Referring to FIGS. 11B and 11C, a buried dielectric layer may be formed on the entire surface of the substrate 1, and thus the buried dielectric layer may fill an area where the sacrificial pattern 20a is absent in the separation trench ST. A chemical mechanical polishing (CMP) process or an etch-back process may be performed such that the sacrificial pattern 20a, the first mask pattern 22, and the buried dielectric layer located above the separation mask pattern SM may be removed. In this case, a reduced sacrificial pattern 20a may remain in the separation trench ST, and the buried dielectric patterns FL may be formed in the separation trench ST. In the separation trench ST, the buried dielectric patterns FL may be disposed on the overlapping regions OR1 and OR2, and the sacrificial pattern 20a may be disposed on the separation regions SR1 and SR2 and the middle region MR.

Figure 11D:
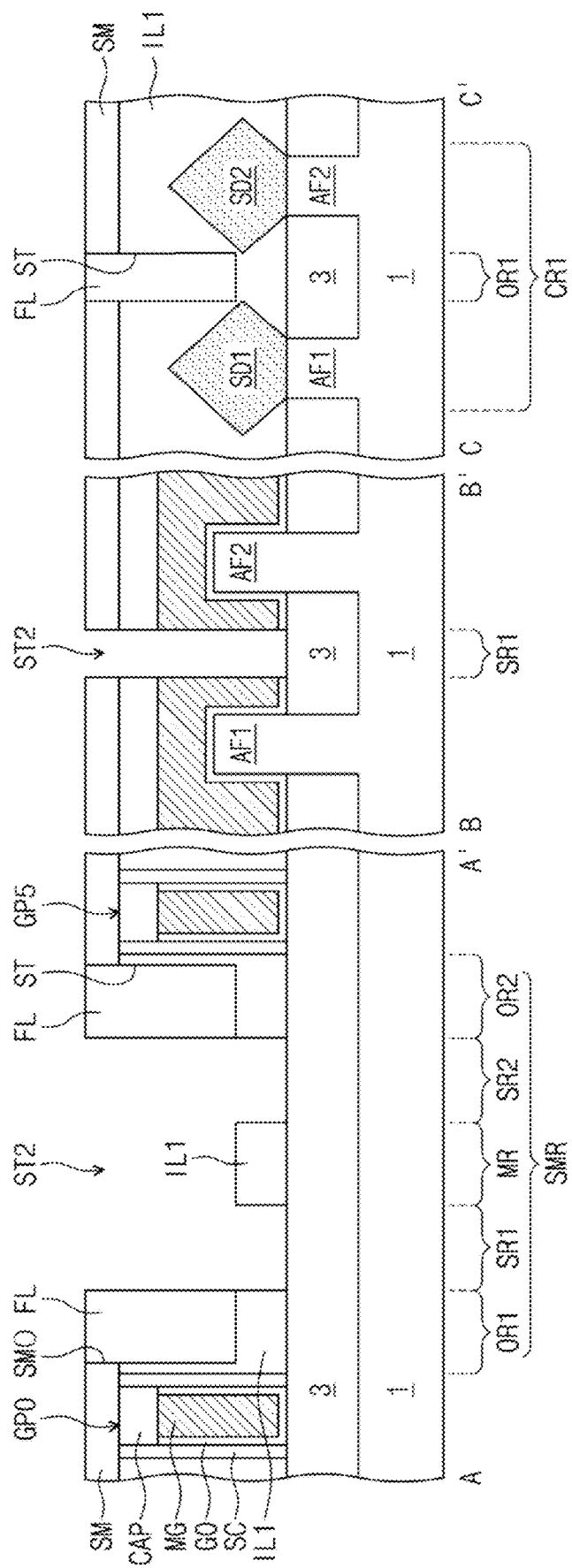

Referring to FIGS. 11C and 11D, the sacrificial pattern 20a may be removed from the separation trench ST. For example, the sacrificial pattern 20a may contain a spin-on-hardmask (SOH) layer or a spin-on-carbon (SOC) layer, and may be easily removed through an oxygen etch or any other suitable etching process. Therefore, the device isolation layer 3 may be exposed on the separation regions SR1 and SR2, and the first interlayer dielectric layer IL1 may be exposed on the middle region MR. A second trench ST2 may be defined to indicate an area where the sacrificial pattern 20a is removed.

Figure 11E:
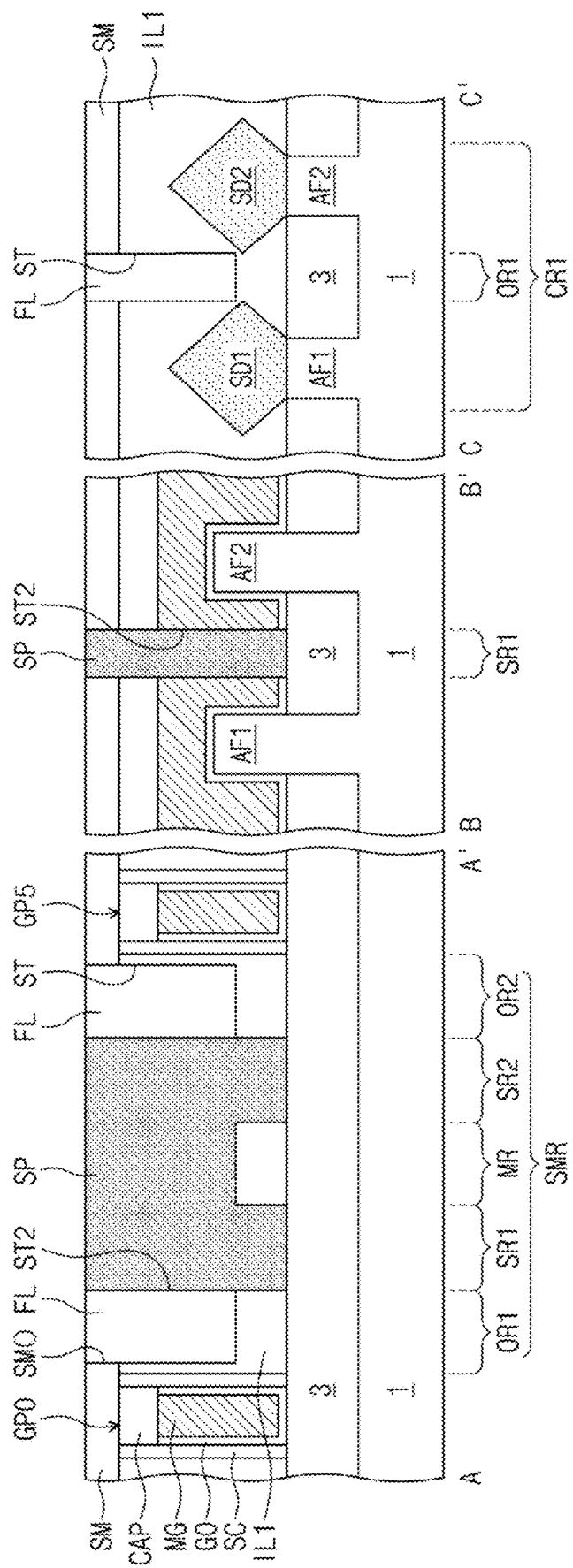

Referring to FIGS. 11D and 11E, a dielectric layer may be formed on the substrate 1 to fill the second separation trench ST2, and then an etch-back process may be performed to form the separation pattern SP in the second separation trench ST2.

The separation mask pattern SM may become the second dielectric layer (see IL2 of FIG. 8B). Subsequently, referring to FIG. 9B, the buried dielectric patterns FL and the first interlayer dielectric layer IL1 may be etched to form the contact holes CH, and the contact holes CH may be filled with a conductive layer to form the contact plugs CT1 and CT2. The semiconductor device of FIG. 9B may be eventually fabricated. When the buried dielectric patterns FL are partially left during the formation of the contact holes CH and then subsequent processes are performed, the semiconductor device of FIG. 10 may be fabricated. Other process steps may be identical or similar to those discussed above. The process described above with reference to FIGS. 11A to 11E may be provided as an alternative way of fabricating the semiconductor device of FIG. 9B or FIG. 10 by using the large etch difference between the carbon rich spin-on-hardmask (SOH) material (or spin-on-carbon (SOC) material) for the sacrificial pattern 20a and the silicon containing silicon oxide ($SiO_2$) material for the buried dielectric pattern FL.

Figure 12A:
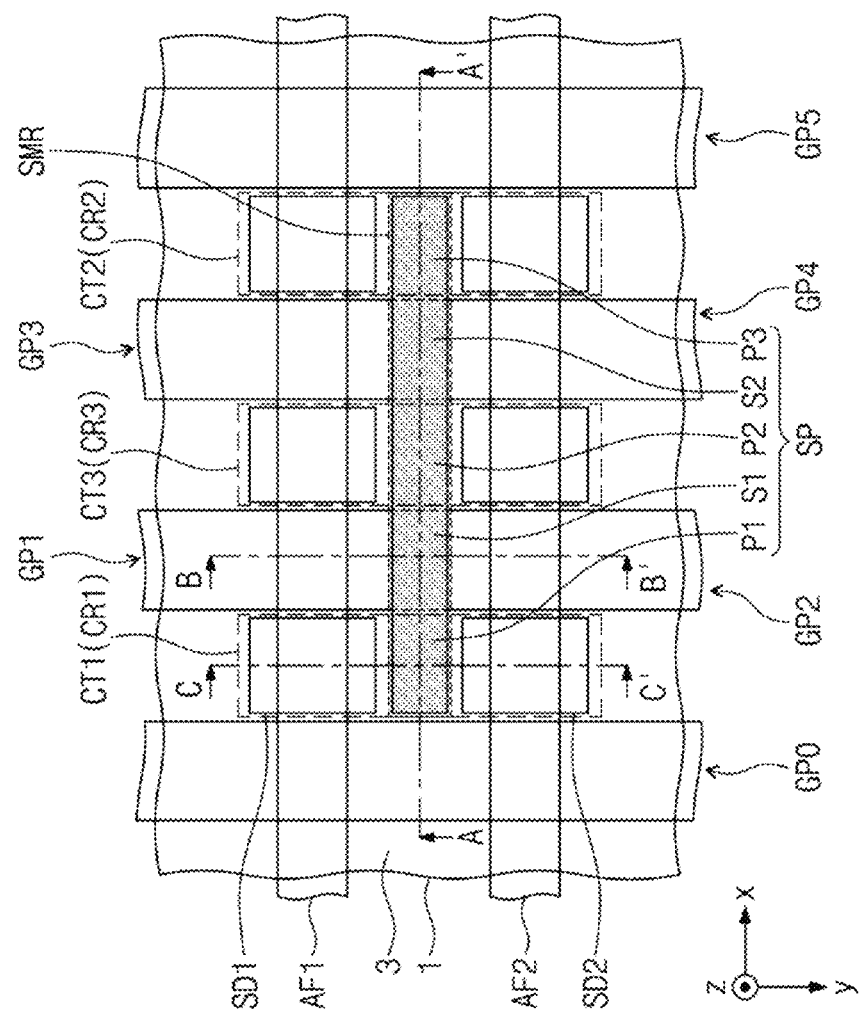
FIG. 12A illustrates a plan view showing a semiconductor device according to an example embodiment of the present inventive concept.
Figure 12B:
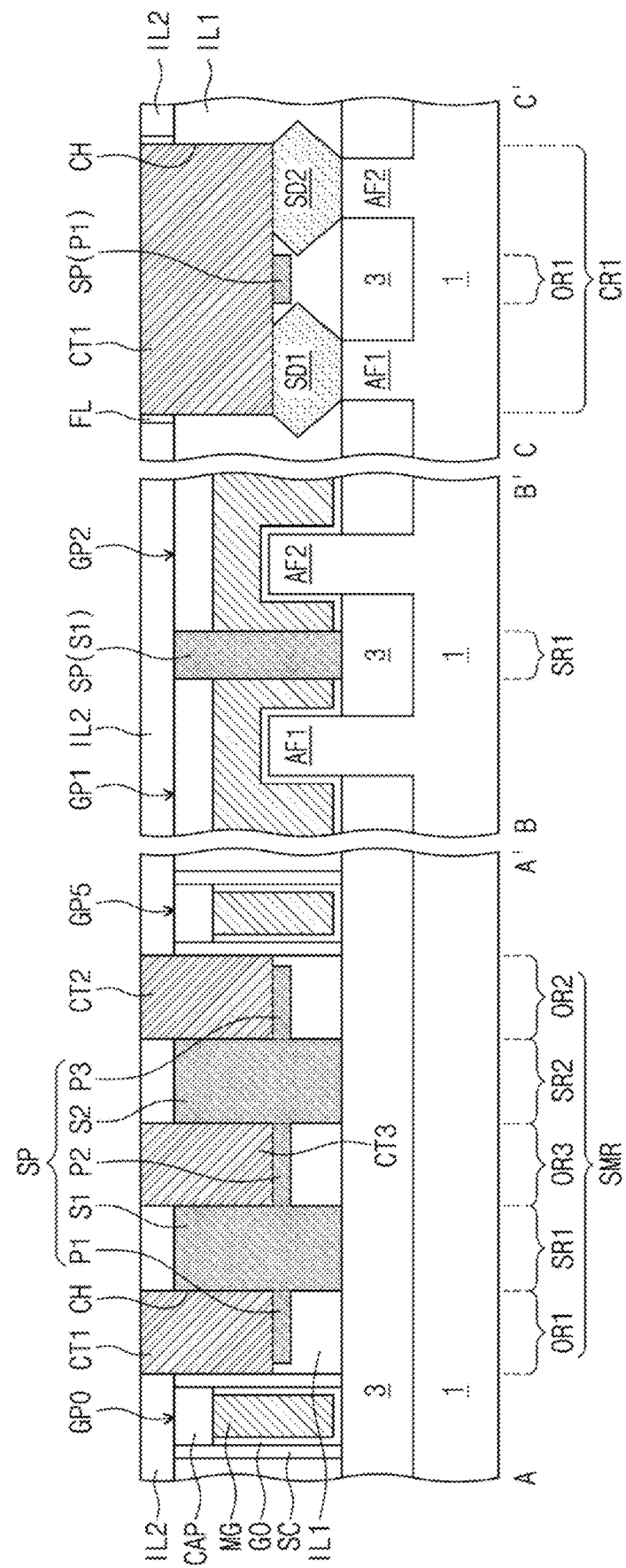
FIG. 12B illustrates a cross-sectional view taken along lines A-A', B-B', and C-C' of FIG. 12A, according to an example embodiment of the present inventive concept.

FIG. 12A illustrates a plan view showing a semiconductor device according to an example embodiment of the present inventive concept. FIG. 12B illustrates a cross-sectional view taken along lines A-A', B-B', and C-C' of FIG. 12A, according to an example embodiment of the present inventive concept.

Referring to FIGS. 12A and 12B, a semiconductor device according to the present example embodiment may be configured such that the substrate 1 may include a third contact region CR3 disposed between and spaced apart from the first and second contact regions CR1 and CR2. The separation mask opening region SMR may intersect all of the first, second, and third contact regions CR1, CR2, and CR3. The separation mask opening region SMR may thus include a third overlapping region OR3 in addition to the first and second overlapping regions OR1 and OR2. The third overlapping region OR3 may be positioned between the first overlapping region OR1 and the second overlapping region OR2. The first separation region SR1 may be positioned between the first overlapping region OR1 and the third overlapping region OR3. The second separation region SR2 may be positioned between the second overlapping region OR2 and the third overlapping region OR3. The third overlapping region OR3 may be positioned at the middle region MR of FIG. 1B. For example, the middle region MR of FIG. 1B may be replaced with the third overlapping region OR3 in FIG. 12B.

The separation pattern SP may include the first, second, and third protrusion segments P1, P2, and P3, and may also include the first and second separation segments S1 and S2 between the first, second, and third protrusion segments P1, P2, and P3. The first, second, and third protrusion segments P1, P2, and P3 may have the same thickness and height. For example, the second protrusion segment P2 may laterally extend from the first separation segment S1 in a direction away from the first protrusion segment P1, a top surface of the second protrusion segment P2 may be coplanar with a top surface of the first protrusion segment P1, and a bottom surface of the second protrusion segment P2 may be higher than a bottom surface of the first separation segment S1. For example, the third protrusion segment P3 may extend from the second separation segment S2 in a direction away from the second protrusion segment P2, and the third protrusion segment P3 may have a thickness the same as a thickness of the first protrusion segment P1. The first, second, and third protrusion segments P1, P2, and P3 may be thinner than the first and second separation segments S1 and S2. The semiconductor device may further include a third contact plug CT3 between the first and second separation segments S1 and S2. The first, second, and third protrusion segments P1, P2, and P3 may be in contact with bottom surfaces of the first, third, and second contact plugs CT1, CT3, and CT2, respectively. Other configurations may be identical or similar to those discussed with reference to FIGS. 1A to 1C.

The fabrication of the semiconductor device shown in FIGS. 12A and 12B may include forming a third recess by etching the separation pattern SP on the middle region MR when the first and second recesses RC1 and RC2 are formed as illustrated in FIG. 8B, performing subsequent processes, and forming the third contact plug CT3 on the middle region MR of FIG. 1B. For example, the third contact plug CT3 may be formed on the third overlapping region OR3 of FIG. 12B. Accordingly, similar to FIGS. 1A and 1B, no gate-bridges may be formed between the first and second gate patterns GP1 and GP2 on the first separation region SR1, and between the third and fourth gate patterns GP3 and GP4 on the second separation region SR2. Respectively on the first, second and third overlapping regions OR1, OR2 and OR3, the first, second and third contact plugs CT1, CT2 and CT3 may each be connected without failure to the first and second source/drain patterns SD1 and SD2. For example, the first, second and third contact plugs CT1, CT2 and CT3 formed on the first, second, and third contact regions CR1, CR2, and CR3, with each of the first, second and third contact plugs CT1, CT2 and CT3 connecting the first source/drain pattern SD1 and second source/drain pattern SD2, may not have connection failure on the first, second and third overlapping regions OR1, OR2 and OR3, respectively.

Figure 13A:
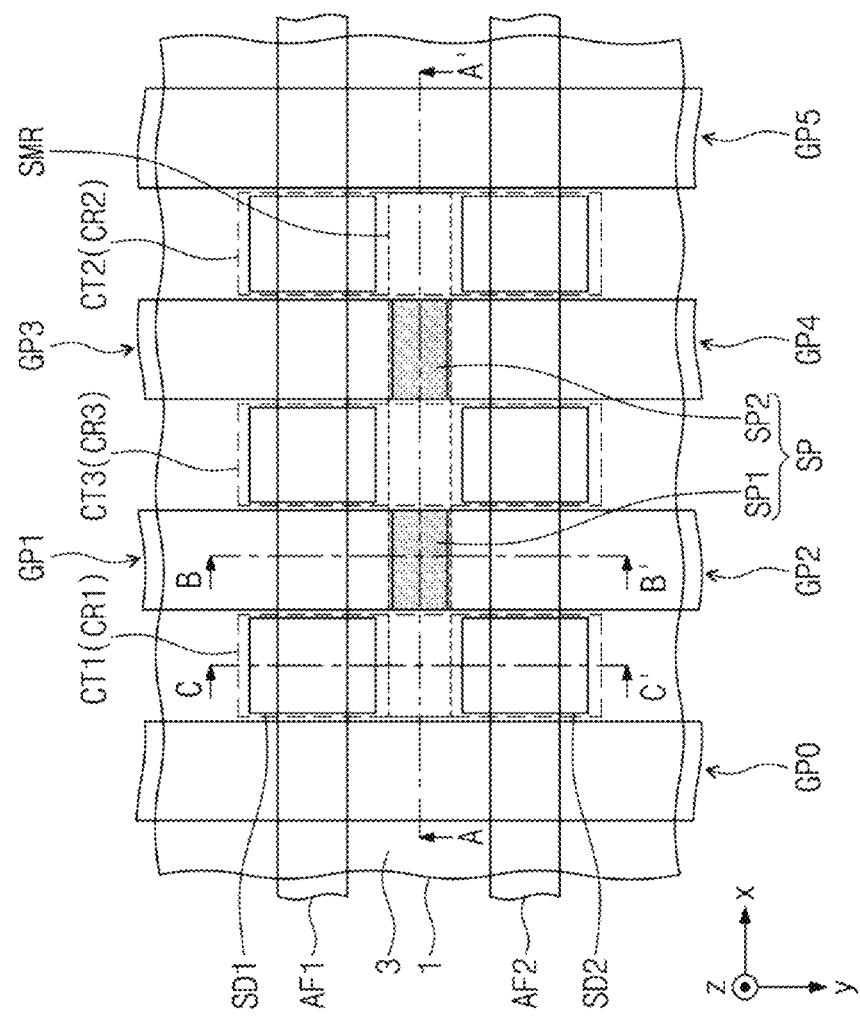
FIG. 13A illustrates a plan view showing a semiconductor device according to an example embodiment of the present inventive concept.
Figure 13B:
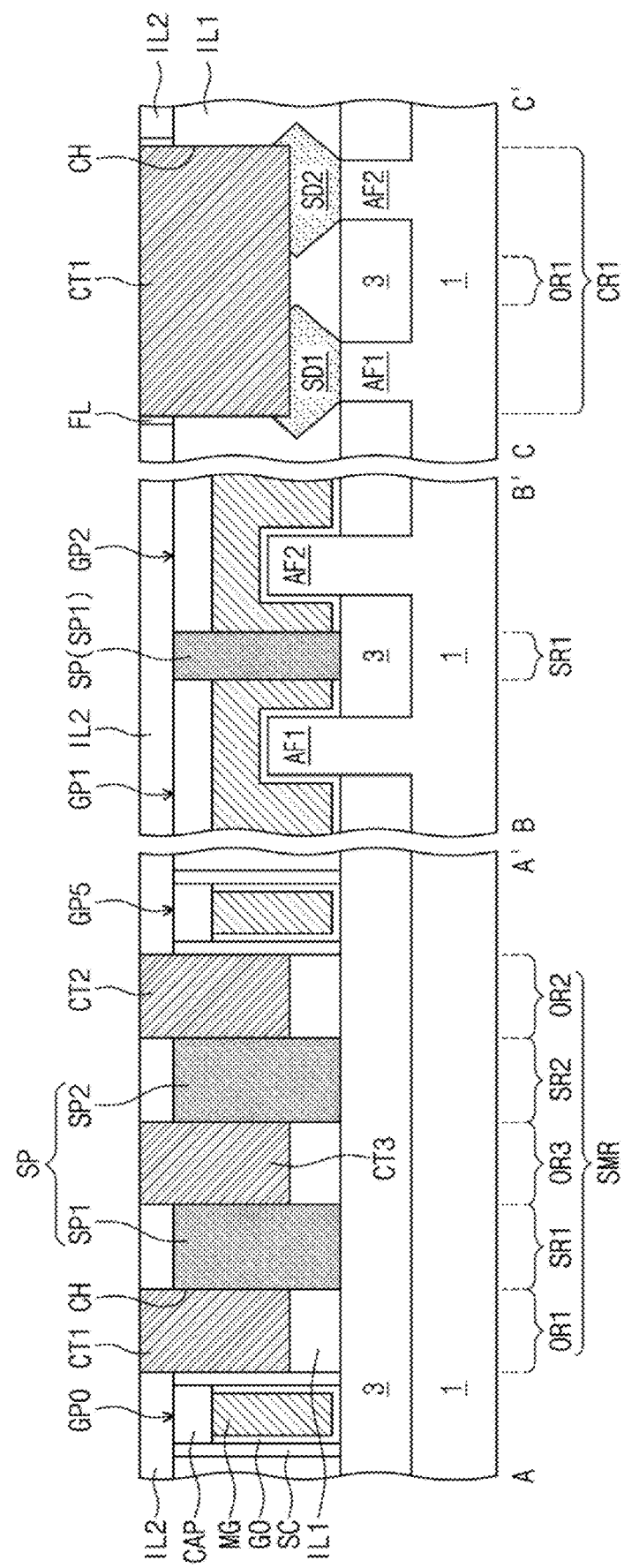
FIG. 13B illustrates a cross-sectional view taken along lines A-A', B-B', and C-C' of FIG. 13A, according to an example embodiment of the present inventive concept.

FIG. 13A illustrates a plan view showing a semiconductor device according to an example embodiment of the present inventive concept. FIG. 13B illustrates a cross-sectional view taken along lines A-A', B-B', and C-C' of FIG. 13A, according to an example embodiment of the present inventive concept.

Referring to FIGS. 13A and 13B, a semiconductor device according to the present example embodiment may be configured such that the separation pattern SP may include a first separation pattern SP1 and a second separation pattern SP2 that are spaced apart from each other. The first separation pattern SP1 may be disposed on the first separation region SR1 and interposed between the first gate pattern GP1 and the second gate pattern GP2. The second separation pattern SP2 may be disposed on the second separation region SR2 and interposed between the third gate pattern GP3 and the fourth gate pattern GP4. The first, second, and third protrusion segments P1, P2, and P3 of FIG. 12B may be absent on the first, second, and third overlapping regions OR1, OR2, and OR3. Other configurations may be identical or similar to those discussed with reference to FIGS. 12A and 12B.

The fabrication of the semiconductor device shown in FIGS. 13A and 13B may be analogous to that of the semiconductor device shown in FIGS. 12A and 12B. For example, the fabrication of the semiconductor device shown in FIGS. 13A and 13B may include, when the first and second recesses RC1 and RC2 are formed as illustrated in FIG. 8B, forming the third recess together with the first and second recesses RC1 and RC2 by completely removing the separation pattern SP from the first, second, and third overlapping regions OR1, OR2, and OR3 to leave none of the first, second, and third protrusion segments P1, P2, and P3, and then performing subsequent processes. Accordingly, similar to FIGS. 12A and 12B, no gate-bridges may be formed between the first and second gate patterns GP1 and GP2 on the first separation region SR1, and between the third and fourth gate patterns GP3 and GP4 on the second separation region SR2. Respectively on the first, second and third overlapping regions OR1, OR2 and OR3, the first, second and third contact plugs CT1, CT2 and CT3 may each be connected without failure to the first and second source/drain patterns SD1 and SD2.

Figure 14:
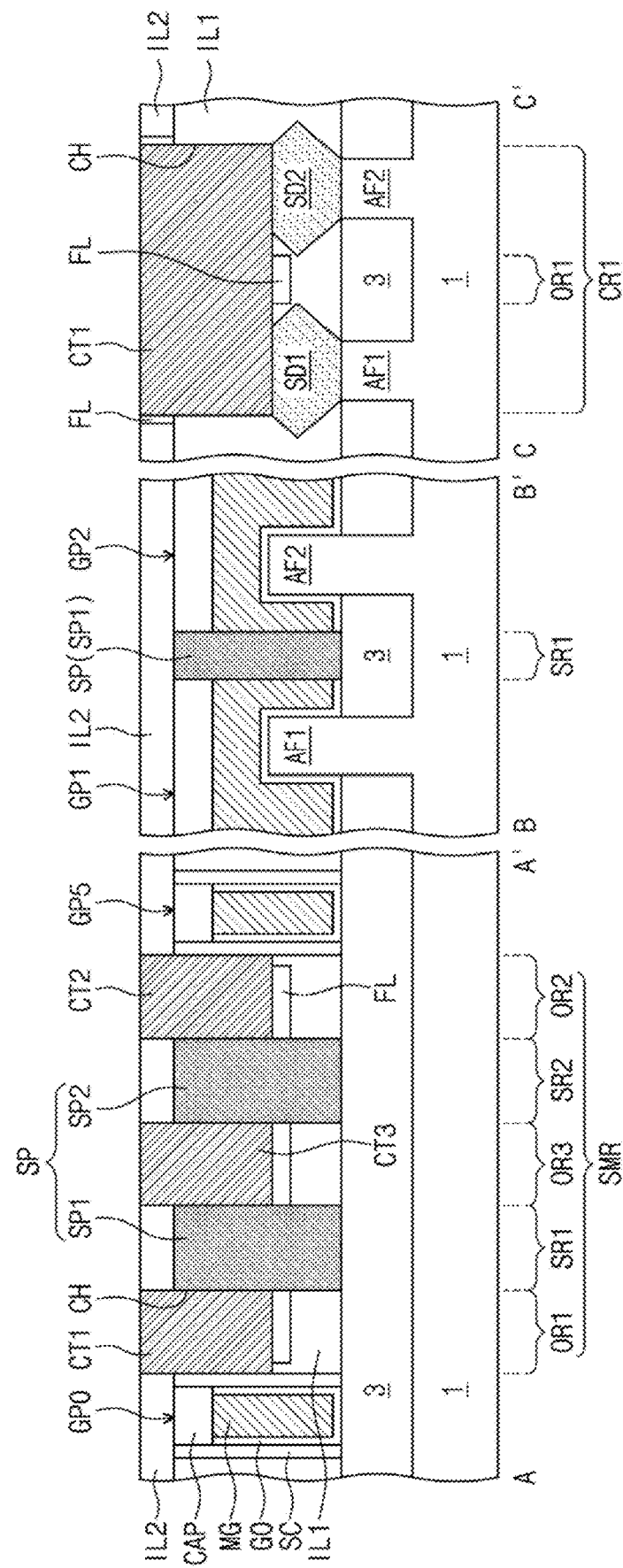
FIG. 14 illustrates a cross-sectional view taken along lines A-A', B-B', and C-C' of FIG. 13A, according to an example embodiment of the present inventive concept.

FIG. 14 illustrates a cross-sectional view taken along lines A-A', B-B', and C-C' of FIG. 13A, according to an example embodiment of the present inventive concept.

Referring to FIGS. 13A and 14, a semiconductor device according to the present example embodiment may further include buried dielectric patterns FL in contact with corresponding bottom surfaces of the first, second, and third contact plugs CT1, CT2, and CT3. Other configurations may be identical or similar to those discussed with reference to FIG. 13B. For example, the separation pattern SP may include a first separation pattern SP1 and a second separation pattern SP2 that are spaced apart from each other, and the first, second, and third protrusion segments P1, P2, and P3 may be absent on the first, second, and third overlapping regions OR1, OR2, and OR3. The fabrication of the semiconductor device shown in FIG. 14 may be analogous to that of the semiconductor device shown in FIG. 10. Accordingly, similar to FIGS. 13A and 13B, no gate-bridges may be formed between the first and second gate patterns GP1 and GP2 on the first separation region SR1 and between the third and fourth gate patterns GP3 and GP4 on the second separation region SR2. Respectively on the first, second and third overlapping regions OR1, OR2 and OR3, the first, second and third contact plugs CT1, CT2 and CT3 may each be connected without failure to the first and second source/drain patterns SD1 and SD2.

Figure 15A:
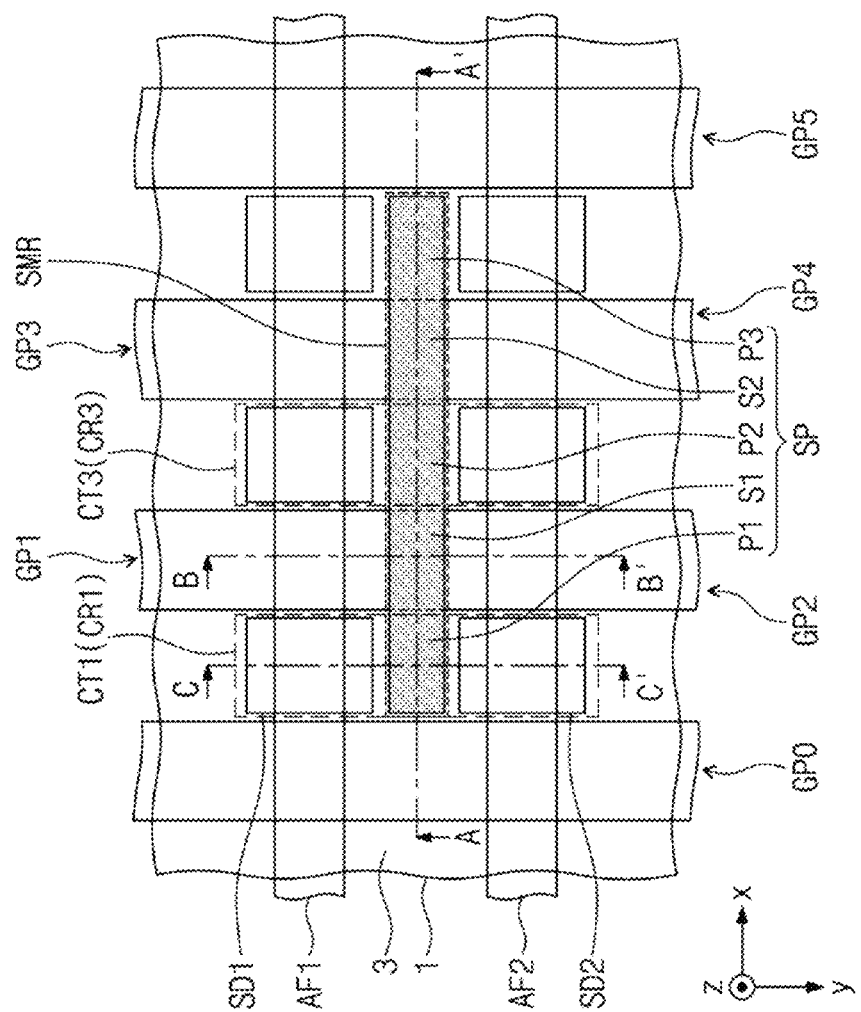
FIG. 15A illustrates a plan view showing a semiconductor device according to an example embodiment of the present inventive concept.
Figure 15B:
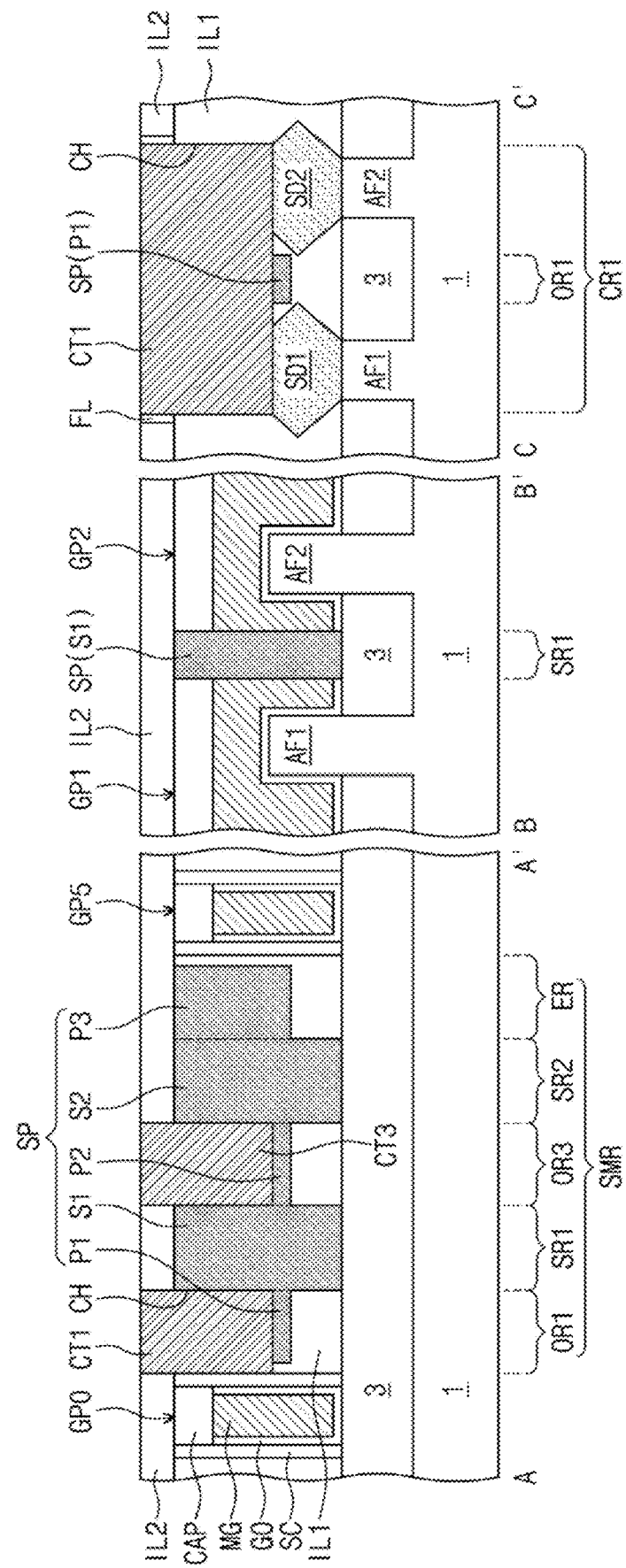
FIG. 15B illustrates a cross-sectional view taken along lines A-A', B-B', and C-C' of FIG. 15A, according to an example embodiment of the present inventive concept.

FIG. 15A illustrates a plan view showing a semiconductor device according to an example embodiment of the present inventive concept. FIG. 15B illustrates a cross-sectional view taken along lines A-A', B-B', and C-C' of FIG. 15A, according to an example embodiment of the present inventive concept.

Referring to FIGS. 15A and 15B, a semiconductor device according to the present example embodiment may be configured such that the substrate 1 may not include the second contact region CR2 of FIGS. 12A and 12B. In addition, the semiconductor device may not include the second contact plug CT2 of FIGS. 12A and 12B. The second overlapping region OR2 of FIGS. 12A and 12B may be renamed as an edge region ER in FIGS. 15A and 15B. The separation pattern SP may include the third protrusion segment P3 on the edge region ER, and the third protrusion segment P3 may have a top surface coplanar with those of the first and second separation segments S1 and S2. The third protrusion segment P3 may be thicker than the first and second protrusion segments P1 and P2. Other configurations may be identical or similar to those discussed with reference to FIGS. 12A and 12B. Accordingly, similar to FIGS. 12A and 12B, no gate-bridges may be formed between the first and second gate patterns GP1 and GP2 on the first separation region SR1, and between the third and fourth gate patterns GP3 and GP4 on the second separation region SR2. Respectively on the first and third overlapping regions OR1 and OR3, the first and third contact plugs CT1 and CT3 may each be connected without failure to the first and second source/drain patterns SD1 and SD2.

Figure 16A:
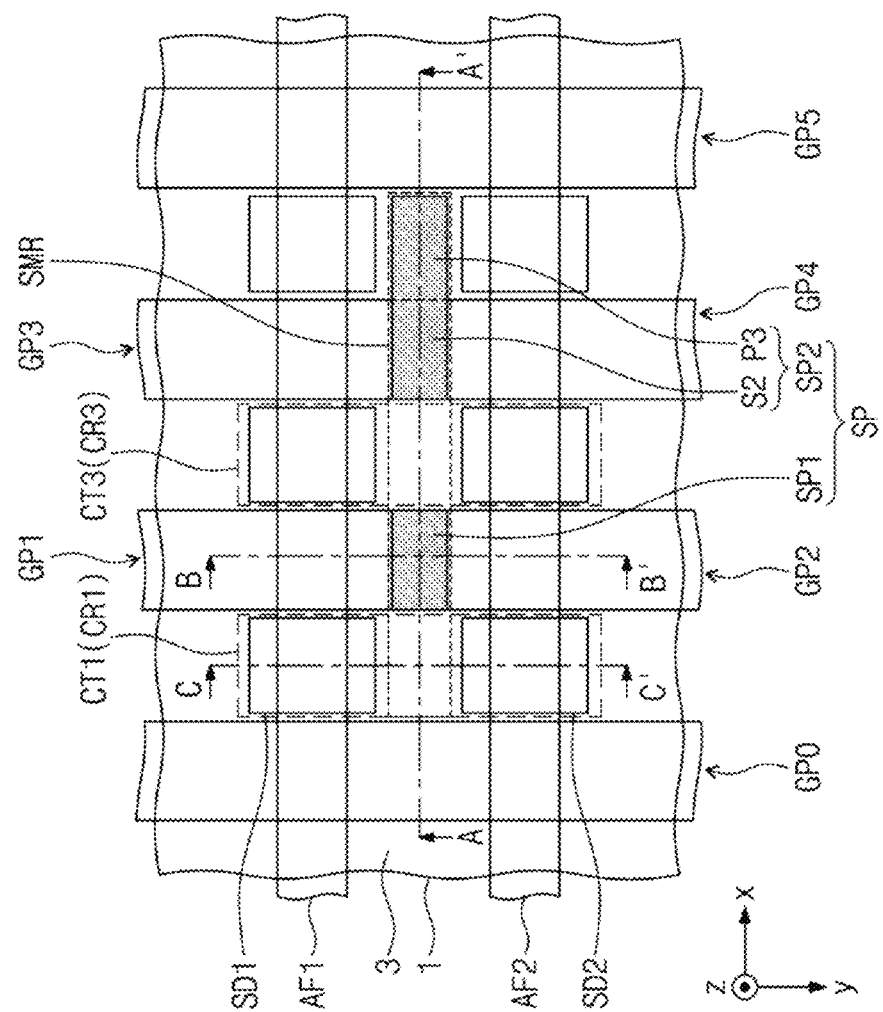
FIG. 16A illustrates a plan view showing a semiconductor device according to an example embodiment of the present inventive concept.
Figure 16B:
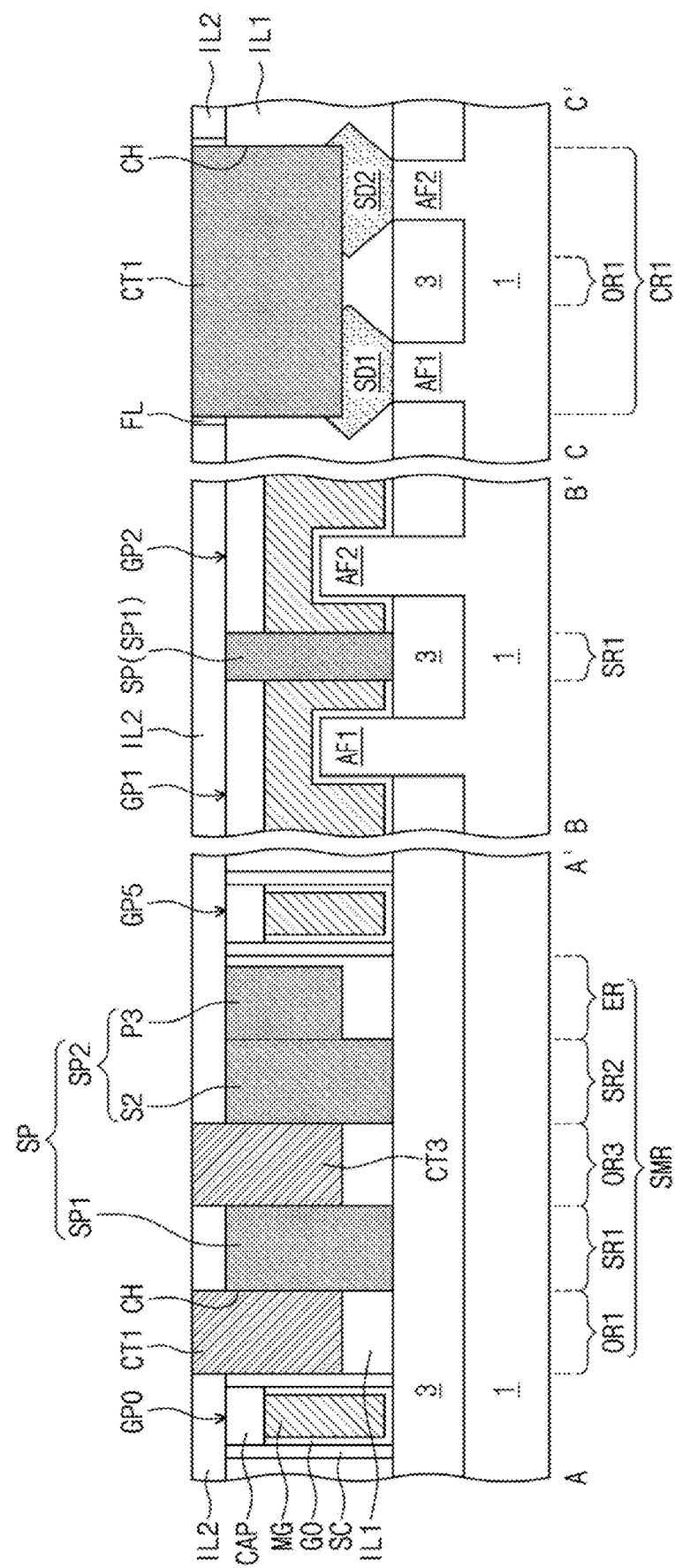
FIG. 16B illustrates a cross-sectional view taken along lines A-A', B-B', and C-C' of FIG. 16A, according to an example embodiment of the present inventive concept.

FIG. 16A illustrates a plan view showing a semiconductor device according to an example embodiment of the present inventive concept. FIG. 16B illustrates a cross-sectional view taken along lines A-A', B-B', and C-C' of FIG. 16A, according to an example embodiment of the present inventive concept.

Referring to FIGS. 16A and 16B, a semiconductor device according to the present example embodiment may be configured such that the separation pattern SP may include the first separation pattern SP1 and the second separation pattern SP2 that are spaced apart from each other. The first separation pattern SP1 may be disposed on the first separation region SR1 and interposed between the first gate pattern GP1 and the second gate pattern GP2. The second separation pattern SP2 may include the second separation segment S2 disposed on the second separation region SR2, and also include the third protrusion segment P3 disposed on the edge region ER and connected to the second separation segment S2. The first and third contact plugs CT1 and CT3 may have their bottom surfaces in direct contact with the first interlayer dielectric layer ILL The separation pattern SP may not include the first protrusion segment P1 and the second protrusion segment P2 that are shown in FIGS. 15A and 15B. Other configurations may be identical or similar to those discussed with reference to FIGS. 15A and 15B. Accordingly, similar to FIGS. 15A and 15B, no gate-bridges may be formed between the first and second gate patterns GP1 and GP2 on the first separation region SR1, and between the third and fourth gate patterns GP3 and GP4 on the second separation region SR2. Respectively on the first and third overlapping regions OR1 and OR3, the first and third contact plugs CT1 and CT3 may each be connected without failure to the first and second source/drain patterns SD1 and SD2.

Figure 17:
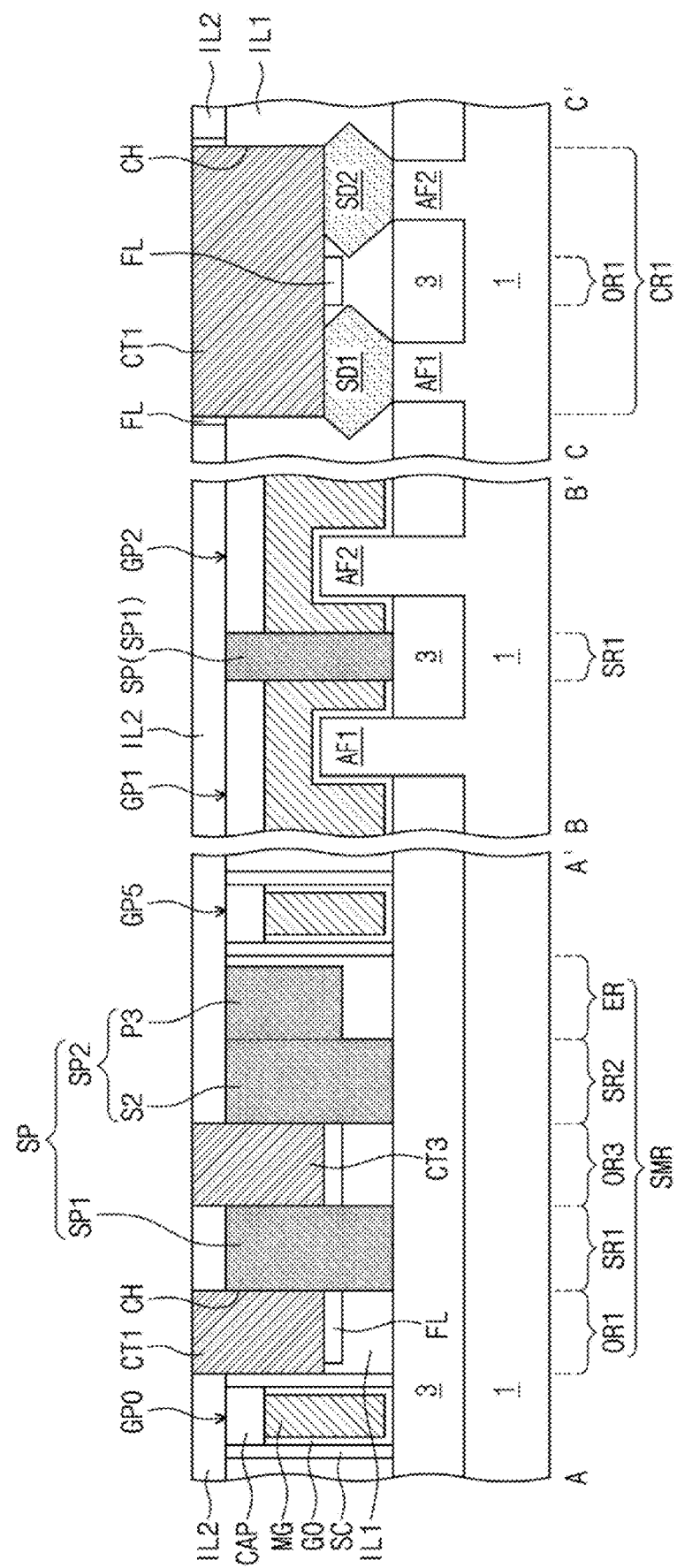
FIG. 17 illustrates a cross-sectional view taken along lines A-A', B-B', and C-C' of FIG. 16A, according to an example embodiment of the present inventive concept.

FIG. 17 illustrates a cross-sectional view taken along lines A-A', B-B', and C-C' of FIG. 16A, according to an example embodiment of the present inventive concept.

Referring to FIG. 17, the first and third contact plugs CT1 and CT3 may have their bottom surfaces in direct contact with the buried dielectric patterns FL. The buried dielectric patterns FL on the first and third overlapping regions OR1 and OR3 may have their bottom surfaces at a height the same as that of a bottom surface of the third protrusion segment P3 of the second separation pattern SP2 on the edge region ER. Other configurations may be identical or similar to those discussed with reference to FIG. 16B. Accordingly, similar to FIGS. 16A and 16B, no gate-bridges may be formed between the first and second gate patterns GP1 and GP2 on the first separation region SR1, and between the third and fourth gate patterns GP3 and GP4 on the second separation region SR2. Respectively on the first and third overlapping regions OR1 and OR3, the first and third contact plugs CT1 and CT3 may each be connected without failure to the first and second source/drain patterns SD1 and SD2.

Figure 18A:
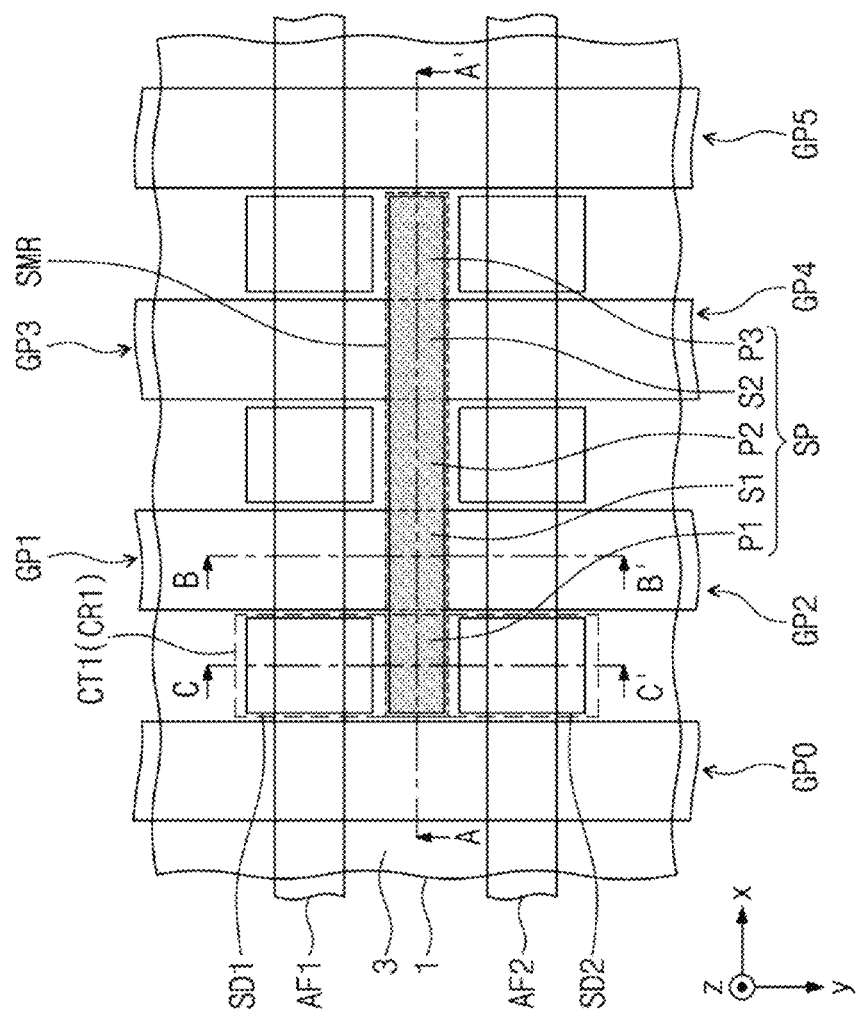
FIG. 18A illustrates a plan view showing a semiconductor device according to an example embodiment of the present inventive concept.
Figure 18B:
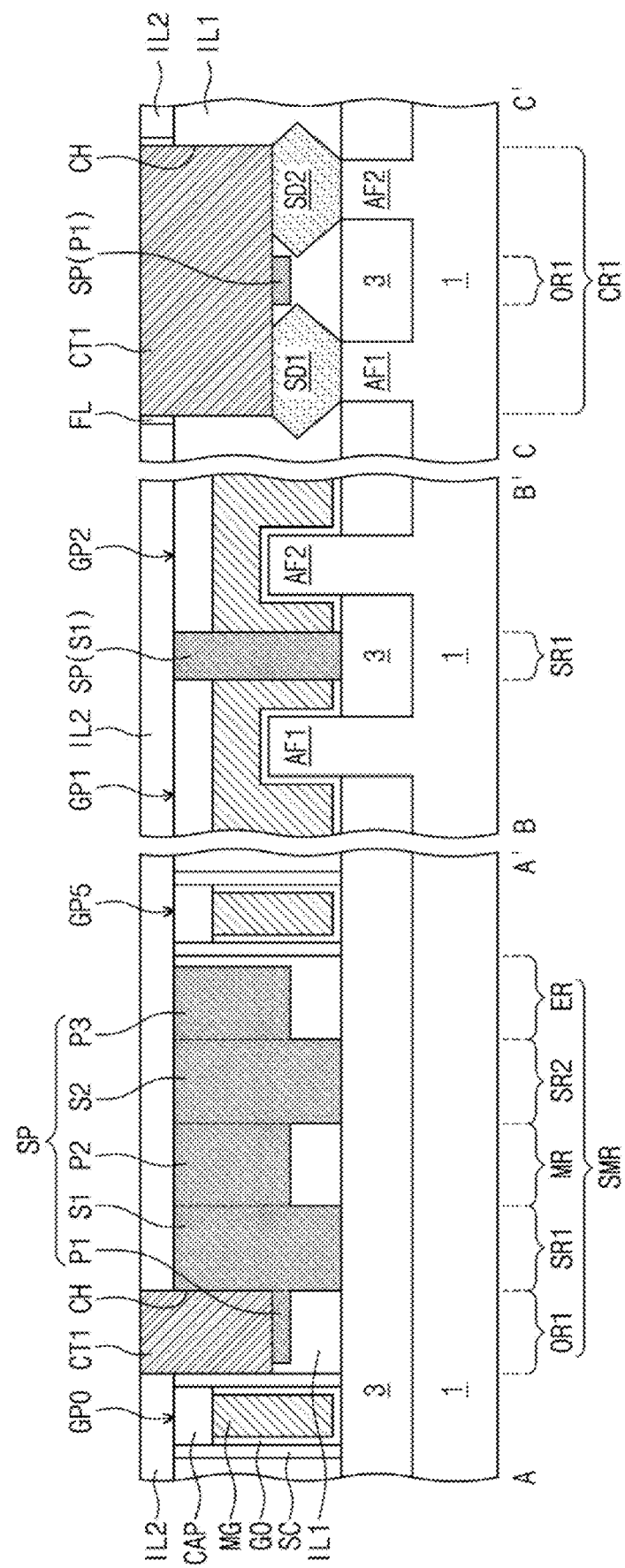
FIG. 18B illustrates a cross-sectional view taken along lines A-A', B-B', and C-C' of FIG. 18A, according to an example embodiment of the present inventive concept.

FIG. 18A illustrates a plan view showing a semiconductor device according to an example embodiment of the present inventive concept. FIG. 18B illustrates a cross-sectional view taken along lines A-A', B-B', and C-C' of FIG. 18A, according to an example embodiment of the present inventive concept.

Referring to FIGS. 18A and 18B, a semiconductor device according to the present example embodiment may be configured such that the substrate 1 may not include the third contact region CR3 of FIGS. 15A and 15B. In addition, the semiconductor device may not include the third contact plug CT3 of FIGS. 15A and 15B. The third overlapping region OR3 of FIGS. 15A and 15B may be renamed back as a middle region MR in FIGS. 18A and 18B. The separation pattern SP may include the second protrusion segment P2 and the third protrusion segment P3 respectively on the middle region MR and the edge region ER, and the second and third protrusion segments P2 and P3 may have their top surfaces coplanar with those of the first and second separation segments S1 and S2. The second and third protrusion segments P2 and P3 may be thicker than the first protrusion segment P1. Other configurations may be identical or similar to those discussed with reference to FIGS. 15A and 15B. Accordingly, similar to FIGS. 15A and 15B, no gate-bridges may be formed between the first and second gate patterns GP1 and GP2 on the first separation region SR1, and between the third and fourth gate patterns GP3 and GP4 on the second separation region SR2. On the first overlapping region OR1, the first contact plug CT1 may be connected without failure to the first and second source/drain patterns SD1 and SD2.

Figure 19A:
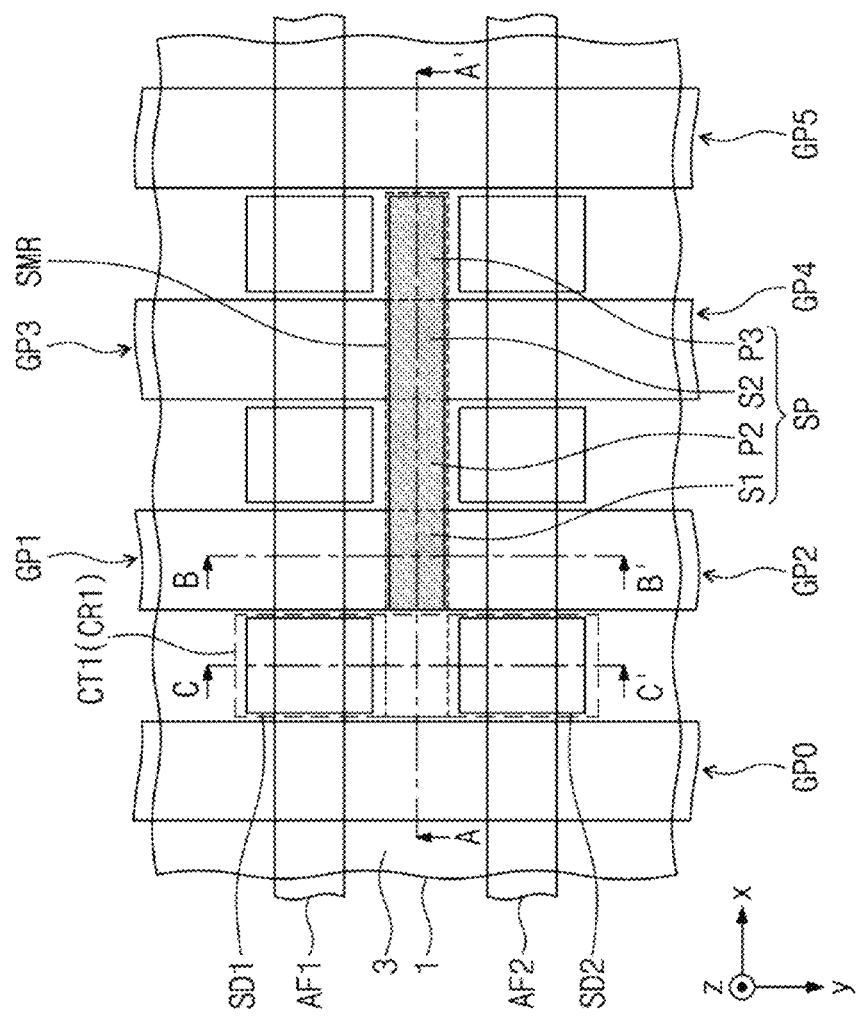
FIG. 19A illustrates a plan view showing a semiconductor device according to an example embodiment of the present inventive concept.
Figure 19B:
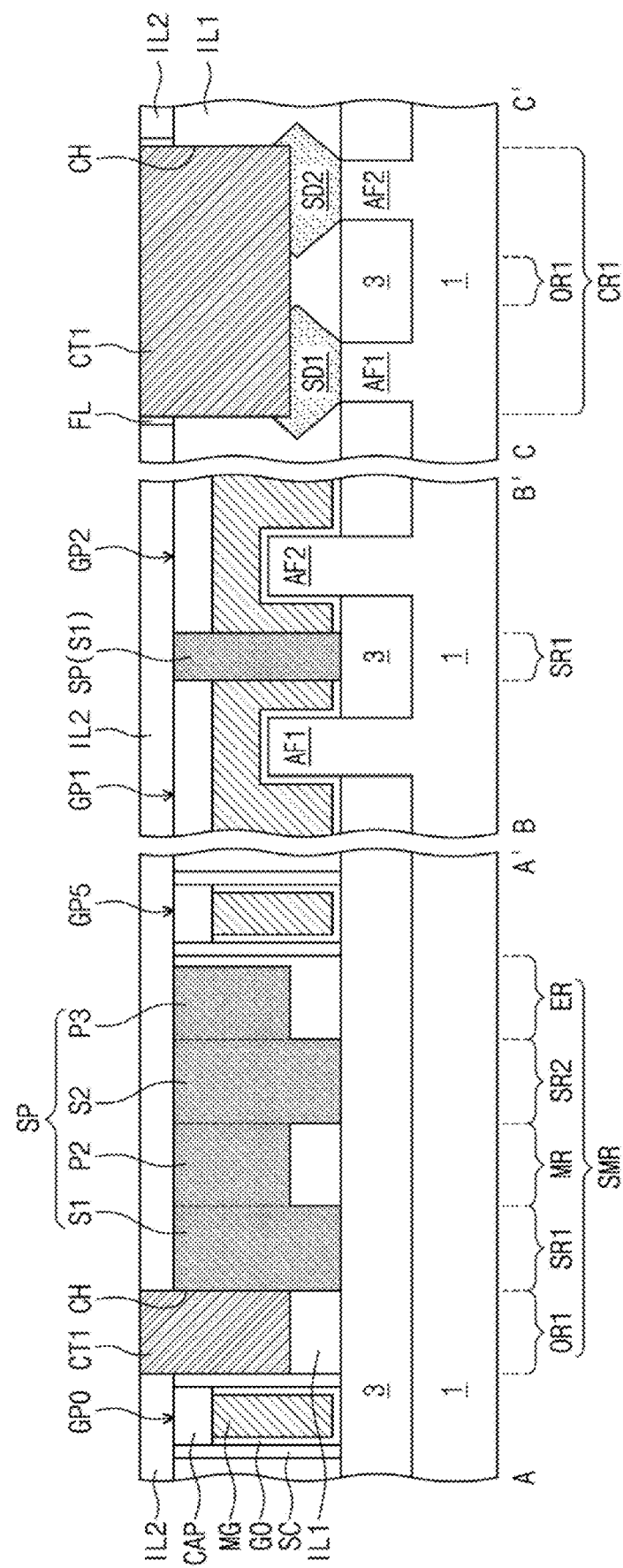
FIG. 19B illustrates a cross-sectional view taken along lines A-A', B-B', and C-C' of FIG. 19A, according to an example embodiment of the present inventive concept.

FIG. 19A illustrates a plan view showing a semiconductor device according to an example embodiment of the present inventive concept. FIG. 19B illustrates a cross-sectional view taken along lines A-A', B-B', and C-C' of FIG. 19A, according to an example embodiment of the present inventive concept.

Referring to FIGS. 19A and 19B, a semiconductor device according to the present example embodiment may be configured such that the separation pattern SP may not include the first protrusion segment P1 of FIGS. 18A and 18B. The first contact plug CT1 may have a bottom surface at a height the same as that of bottom surfaces of the second and third protrusion segments P2 and P3. Other configurations may be identical or similar to those discussed with reference to FIGS. 18A and 18B. Accordingly, similar to FIGS. 18A and 18B, no gate-bridges may be formed between the first and second gate patterns GP1 and GP2 on the first separation region SR1, and between the third and fourth gate patterns GP3 and GP4 on the second separation region SR2. On the first overlapping region OR1, the first contact plug CT1 may be connected without failure to the first and second source/drain patterns SD1 and SD2.

Figure 20:
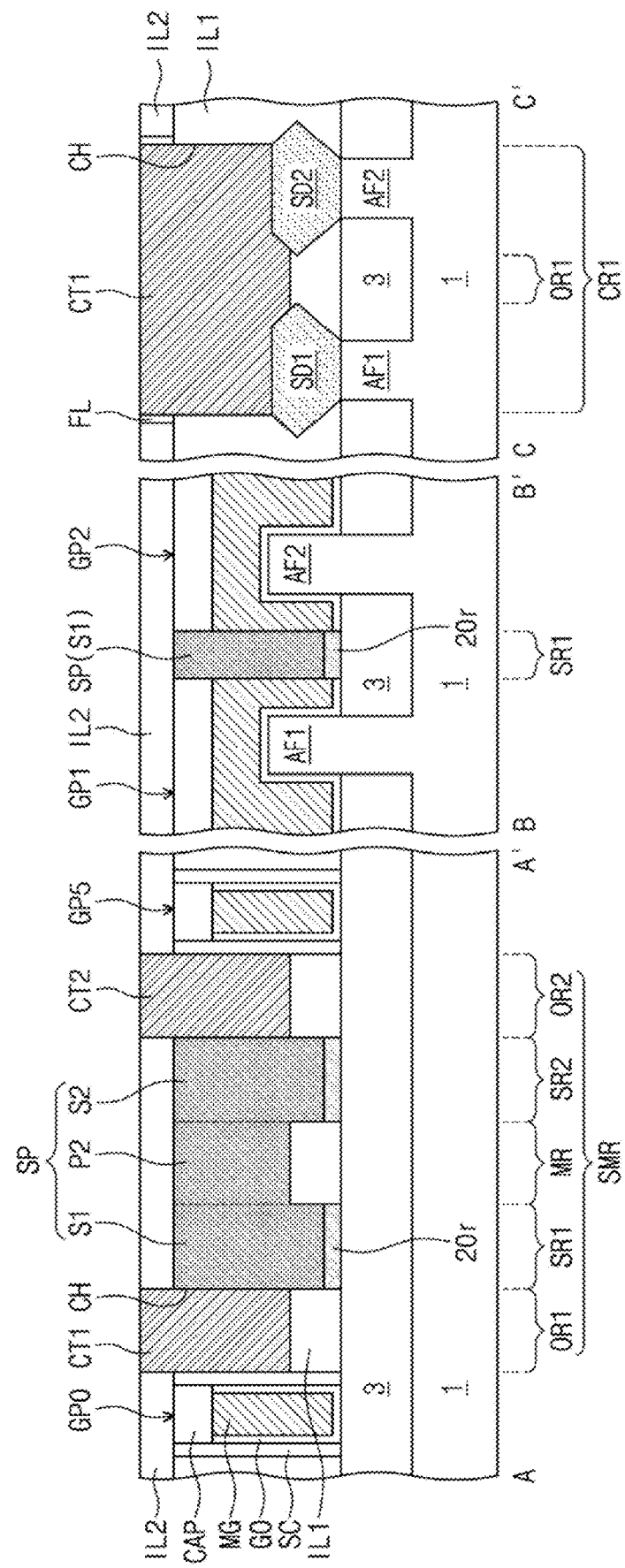
FIG. 20 illustrates a cross-sectional view taken along lines A-A', B-B', and C-C' of FIG. 9A, according to an example embodiment of the present inventive concept.

FIG. 20 illustrates a cross-sectional view taken along lines A-A', B-B', and C-C' of FIG. 9A, according to an example embodiment of the present inventive concept.

Referring to FIG. 20, a residual sacrificial pattern 20r may be interposed between the separation pattern SP and the device isolation layer 3 of FIG. 9B. For example, the residual sacrificial pattern 20r may be interposed between the device isolation layer 3 and the first separation segment S1 of the separation pattern SP and between the device isolation layer 3 and the second separation segment S2 of the separation pattern SP. The residual sacrificial pattern 20r may include a material different from that of the separation pattern SP. The residual sacrificial pattern 20r may include a material having an etch selectivity with respect to the separation pattern SP. The residual sacrificial pattern 20r may include, for example, a spin-on-hardmask (SOH) layer or a spin-on-carbon (SOC) layer. Thus, the residual sacrificial pattern 20r (or the sacrificial pattern 20a) may include a material having an etch selectivity with respect to a material of the first interlayer dielectric layer IL1.

The residual sacrificial pattern 20r may be called a subsidiary separation pattern. For example, the residual sacrificial pattern 20r may assist in dividing the gate patterns GP1, GP2, GP3, and GP4. Alternatively, the residual sacrificial pattern 20r and the separation pattern SP may be integrally connected to form a separation pattern as a whole. In this case, the residual sacrificial pattern 20r may be called a first separation pattern, and the separation pattern SP may be called a second separation pattern. Other configurations may be identical or similar to those discussed with reference to FIG. 9B. Accordingly, similar to FIGS. 9A and 9B, no gate-bridges may be formed between the first and second gate patterns GP1 and GP2 on the first separation region SRL and between the third and fourth gate patterns GP3 and GP4 on the second separation region SR2. Respectively on the first and second overlapping regions OR1 and OR2, the first and second contact plugs CT1 and CT2 may each be connected without failure to the first and second source/drain patterns SD1 and SD2.

The fabrication of the semiconductor device of FIG. 20 may include, when the sacrificial pattern 20a is removed in the step of FIGS. 11C and 11D, leaving a portion of the sacrificial pattern 20a to form the residual sacrificial pattern 20r, and performing subsequent processes. Other process steps may be identical or similar to those discussed with reference to FIGS. 11A to 11E.

The residual sacrificial pattern 20r may be interposed between the separation pattern SP and the device isolation layer 3 in the examples shown in FIGS. 13B, 16B, and 19B.

According to the present inventive concept, a semiconductor device may increase in reliability.

In a method of fabricating a semiconductor device according to the present inventive concept, at least a portion of a separation pattern may be previously removed from an overlapping region and a buried dielectric pattern is formed of a material similar to that of interlayer dielectric layers, and therefore, it may be possible to prevent process defects such as contact-connection failure. As a result, a yield may increase.

Although the present inventive concept has been described in connection with some specific example embodiments of the present inventive concept illustrated in the accompanying drawings, it will be understood by those skilled in the art that various changes and modifications may be made to the example embodiments without departing from the spirit and scope of the present inventive concept as defined in the appended claims.

What is claimed is:

1. A semiconductor device, comprising:
a first gate pattern and a second gate pattern that are spaced apart from each other in a first direction on a substrate, each of the first gate pattern and the second gate pattern extending in the first direction;
a separation pattern disposed between the first gate pattern and the second gate pattern and being in direct contact with the first gate pattern and the second gate pattern, the separation pattern extending in a second direction that intersects the first direction;
a third gate pattern spaced apart in the second direction from the first gate pattern, the third gate pattern extending in the first direction; and
an interlayer dielectric layer disposed between the first gate pattern and the third gate pattern,
wherein the separation pattern includes a material different from a material of the interlayer dielectric layer, and a bottom surface of the separation pattern has an uneven structure.

2. The semiconductor device of claim 1, further comprising a contact plug adjacent to one sidewall of the first gate pattern, wherein
the contact plug extends in the first direction and adjoins the separation pattern,
a portion of the separation pattern extends to be in contact with a bottom surface of the contact plug,
the bottom surface of the separation pattern has a first depth between the first gate pattern and the second gate pattern,
the bottom surface of the separation pattern has a second depth below the contact plug, and
the first depth is greater than the second depth.

3. The semiconductor device of claim 1, further comprising a contact plug adjacent to one sidewall of the first gate pattern,
wherein the contact plug extends in the first direction and adjoins the separation pattern, and
the separation pattern includes:
a first separation segment disposed between the first gate pattern and the second gate pattern; and
a first part that extends from the first separation segment and is positioned below the contact plug, with the first part being in contact with a bottom surface of the contact plug.

4. The semiconductor device of claim 3, wherein
a bottom surface of the first separation segment is lower than a bottom surface of the first part,
a top surface of the first separation segment is higher than a top surface of the first part, and
a thickness of the first separation segment is greater than a thickness of the first part.

5. The semiconductor device of claim 3, wherein a sidewall of the first part is spaced apart from a sidewall of the contact plug, with the sidewall of the first part being adjacent to the sidewall of the contact plug.

6. The semiconductor device of claim 3, wherein
the separation pattern further includes a second part that extends from the first separation segment in a direction away from the first part,
a top surface of the second part is coplanar with a top surface of the first part, and
a bottom surface of the second part is higher than a bottom surface of the first separation segment.

7. The semiconductor device of claim 6, further comprising a fourth gate pattern spaced apart from the third gate pattern in the first direction,
wherein the separation pattern further includes a second separation segment in contact with the second part, with the second separation segment being positioned between the third gate pattern and the fourth gate pattern.

8. The semiconductor device of claim 7, wherein
a top surface of the second separation segment is coplanar with a top surface of the first separation segment, and
a bottom surface of the second separation segment is at a height the same as a height of the bottom surface of the first separation segment.

9. The semiconductor device of claim 7, wherein
the separation pattern further includes a third part that extends from the second separation segment in a direction away from the second part, and
the third part has a thickness the same as a thickness of the first part.

10. A semiconductor device, comprising:
a first active fin and a second active fin that protrude from a substrate and are spaced apart from each other;

a device isolation layer that covers a top surface of the substrate and exposes a top surface and a lateral surface of the first active fin and a top surface and a lateral surface of the second active fin;

a first gate pattern that covers the top surface and the lateral surface of the first active fin;

a second gate pattern that is spaced apart from the first gate pattern in a first direction and covers the top surface and the lateral surface of the second active fin;

a first interlayer dielectric layer that covers a lateral surface of the first gate pattern; and a first separation pattern disposed on the device isolation layer between the first gate pattern and the second gate pattern, the first separation pattern being in direct contact with the first gate pattern and the second gate pattern, wherein the first separation pattern includes a material different from a material of the first interlayer dielectric layer, and the first separation pattern includes:
- a first separation segment disposed between the first gate pattern and the second gate pattern; and
- a first part that extends from the first separation segment and is positioned outside one sidewall of the first gate pattern,
- wherein a top surface of the first part is coplanar with a top surface of the first separation segment, and
- a bottom surface of the first part is higher than a bottom surface of the first separation segment.

11. The semiconductor device of claim 10, further comprising:
a third gate pattern disposed on the substrate and spaced apart from the first gate pattern in a second direction intersecting the first direction; and a fourth gate pattern spaced apart from the third gate pattern in the first direction, wherein the first separation pattern further includes a second separation segment in contact with the first part, with the second separation segment being positioned between the third gate pattern and the fourth gate pattern.

12. The semiconductor device of claim 11, wherein
a top surface of the second separation segment is coplanar with the top surface of the first separation segment, and
a bottom surface of the second separation segment is at a height the same as a height of the bottom surface of the first separation segment.

13. The semiconductor device of claim 11, wherein the first separation pattern further includes a second part that extends from the second separation segment in a direction away from the first part, and
a bottom surface of the second part is higher than a bottom surface of the second separation segment.

14. The semiconductor device of claim 10, further comprising a contact plug that is adjacent to the first gate pattern and extends in the first direction,
wherein the first part is in contact with a bottom surface of the contact plug.

15. The semiconductor device of claim 10, further comprising:
a contact plug adjacent to another sidewall of the first gate pattern and spaced apart from the first part;

a second interlayer dielectric layer disposed between the first part and the substrate and between the contact plug and the substrate; and a buried dielectric pattern disposed between the contact plug and the second interlayer dielectric layer, wherein a bottom surface of the buried dielectric pattern is at a height the same as a height of the bottom surface of the first part.

16. The semiconductor device of claim 10, further comprising:
a third gate pattern spaced apart from the first gate pattern in a second direction intersecting the first direction;

a fourth gate pattern spaced apart from the third gate pattern in the first direction; and a second separation pattern disposed between the third gate pattern and the fourth gate pattern, the second separation pattern being spaced apart from the first separation pattern.

17. A semiconductor device, comprising:
a first gate pattern and a second gate pattern that are spaced apart from each other in a first direction on a substrate;

a first interlayer dielectric layer being in contact with a sidewall of the first gate pattern;

a separation pattern disposed between the first gate pattern and the second gate pattern and being in direct contact with the first gate pattern and the second gate pattern;

a first source/drain pattern positioned adjacent to the first gate pattern;

a second source/drain pattern positioned adjacent to the second gate pattern; and a contact plug being in direct contact with top surfaces of the first and second source/drain patterns, wherein the separation pattern includes a material different from a material of the first interlayer dielectric layer, a bottom surface of the contact plug has an uneven structure, and the separation pattern includes:
- a first separation segment disposed between the first gate pattern and the second gate pattern; and
- a first part that laterally extends from the first separation segment and is spaced apart from the contact plug.

18. The semiconductor device of claim 17, wherein a bottom surface of the first part is at a height the same as a height of a lowermost end of the contact plug.

19. The semiconductor device of claim 17, wherein
a top surface of the first part is coplanar with a top surface of the first separation segment, and
a bottom surface of the first part is higher than a bottom surface of the first separation segment.

20. The semiconductor device of claim 17, further comprising a residual sacrificial pattern disposed between the separation pattern and the substrate.

* * * * *